US007655489B2

(12) United States Patent
Hall et al.

(10) Patent No.: US 7,655,489 B2
(45) Date of Patent: Feb. 2, 2010

(54) MONOLITHICALLY-PUMPED ERBIUM-DOPED WAVEGUIDE AMPLIFIERS AND LASERS

(75) Inventors: Douglas Hall, South Bend, IN (US); Mingjun Huang, Notre Dame, IN (US)

(73) Assignee: The University of Notre Dame Du Lac, Notre Dame, IN (US)

(*) Notice: Subject to any disclaimer, the term of this patent is extended or adjusted under 35 U.S.C. 154(b) by 0 days.

(21) Appl. No.: 12/123,257

(22) Filed: May 19, 2008

(65) Prior Publication Data

US 2008/0285610 A1    Nov. 20, 2008

Related U.S. Application Data

(63) Continuation-in-part of application No. 12/105,624, filed on Apr. 18, 2008, which is a continuation of application No. PCT/US2006/060075, filed on Oct. 19, 2006.

(60) Provisional application No. 60/727,831, filed on Oct. 19, 2005.

(51) Int. Cl.
*H01L 21/00* (2006.01)
*H01L 21/3115* (2006.01)
*H01L 21/316* (2006.01)

(52) U.S. Cl. ........... 438/31; 257/E21.248; 257/E21.286

(58) Field of Classification Search .......... 257/E21.248, 257/E21.286, E33.067; 372/45.011; 359/337.3; 438/31
See application file for complete search history.

(56) References Cited

U.S. PATENT DOCUMENTS

| 5,461,637 | A | 10/1995 | Mooradian et al. |
| 5,661,743 | A | 8/1997 | Nagai |
| 6,542,527 | B1 | 4/2003 | Gopinath et al. |
| 6,912,083 | B2 | 6/2005 | Ohishi et al. |

OTHER PUBLICATIONS

Barrios, et al., Electrical Properties of InAlP Native Oxides for GaAs-Based MOS Applications, Proceedings of the International Symposia: III-Nitride Based Semiconductor Electronics and Optical Devices and Thirty-Fourth State-Of-The-Art Program On Compound Semiconductors (SOTAPOCS XXXIV), vol. 2001-1, pp. 258-264.*

International Bureau, International Preliminary Report on Patentability and Written Opinion for International Application No. PCT/US2006/060075, Apr. 23, 2008, 5 pages.

Kou et al., "Er-Doped AlGaAs Native Oxides: photoluminescence Characterization and Process Optimization," IEEE Journal of Selected Topics in Quantum Electronics, Jul./Aug. 2002, pp. 880-890, vol. 8, No. 4.

International Searching Authority, "International Search Report for International Application No. PCT/US06/60075", Oct. 2, 2007, 2 pages.

International Searching Authority, "Written Opinion of the International Searching Authority for International Application No. PCT/US06/60075", Oct. 2, 2007, 5 pages.

* cited by examiner

*Primary Examiner*—Charlie Peng
(74) *Attorney, Agent, or Firm*—Ladas & Parry LLP

(57) ABSTRACT

Disclosed is a method of doping an oxide. The example method includes forming at least one of an AlGaAs oxide or an InAlP oxide on a GaAs substrate, and incorporating Erbium into the at least one AlGaAs oxide or InAlP oxide via ion implantation to form an Erbium-doped oxide layer. The example method also includes annealing the substrate and the at least one AlGaAs oxide or InAlP oxide.

26 Claims, 26 Drawing Sheets

(a)

(b)

Step 1. Simultaneous Surface (InAlP) and Lateral (AlGaAs) Oxidation

Step 2. Active Region Formation by Selective Area Er-implantation

Step 3. Amorphous Silicon Deposition by Sputtering

Step 4. After Liftoff, Silicon Diode Layer Deposited as a Top Cladding Layer

MONOLITHICALLY-PUMPED ERBIUM-DOPED WAVEGUIDE AMPLIFIERS AND LASERS

RELATED APPLICATION

This application is a continuation-in-part of U.S. application Ser. No. 12/105,624 filed on Apr. 18, 2008, which claims priority to International Application No. PCT/US2006/060075 entitled "Monolithically-Pumped Erbium-Doped Waveguide Amplifiers and Lasers," filed Oct. 19, 2006, which claims priority to U.S. Provisional Patent Application No. 60/727,831, entitled "Oxidized InAlP As Host For Optically-Active Er," filed on Oct. 19, 2005, all of which are hereby incorporated by reference in their entirety.

GOVERNMENT INTEREST STATEMENT

This disclosure was made, at least in part, with government support under Grant No. ECS-0123501, awarded by the National Science Foundation, and/or Grant No. AF-F49620-01-1-0331 awarded by the Air Force Office Of Scientific Research (AFOSR).

FIELD OF THE DISCLOSURE

This disclosure relates generally to waveguides with Erbium-doped layers, and, more particularly, to monolithically-pumped Erbium-doped waveguide amplifiers and lasers.

BACKGROUND

With the rapid growth of data communications traffic, wavelength division multiplexing (WDM) systems are being employed in metropolitan area networks (MAN). Such growth propels a desire for more compact, more functional, and low cost optical components. In particular, waveguide amplifiers are optical integrated products well suited for MAN applications.

While many benefits may be realized through Erbium-doped materials, a cost judicious Erbium-based amplifier is, so far, unavailable. Efforts to realize such amplifier components, both active and passive, are hindered by challenges inherent with Erbium properties. For example, a waveguide amplifier and/or light source typically requires a high Erbium (Er) doping level to compensate for small optical transition cross-sections of Er and limited feasible waveguide lengths (e.g., a few to tens of centimeters). As such, selection of a proper Er-host material may be more important to minimize deleterious high concentration effects.

DETAILED DESCRIPTION

Among several types of optical amplifiers, Erbium-doped waveguide amplifiers (EDWAs) are being extensively explored due to their compact integrated size and the performance advantages inherited from Erbium doped fiber amplifiers (EDFAs). Such performance advantages include, but are not limited to, a low noise figure, a negligible polarization dependence, a good temperature stability, and an absence of inter-channel crosstalk.

As described in further detail below, example wet thermal oxides of AlGaAs and InAlP grown on GaAs substrates may exhibit several beneficial qualities as Er host materials that, among other benefits, provide a high Er solubility and a broadband emission competitive to other glass Er host materials currently in use. Such example native oxides are built on GaAs substrates and offer a unique key advantage over other host materials in their potential for monolithic optoelectronics integration with light sources, detectors, etc. Compact chip-scale integration provides several key benefits including, but not limited to, increased yield and reliability of chips because integration results in fewer fabrication steps, eliminates the need for assembling and alignment of individual components, and thereby leads to throughput increases and cost reductions, all of which are of major importance for MAN applications.

Native oxide materials for further rare-earth host optimization, development of low loss native oxide waveguides, and evaluation of various possible integration schemes bring forth low-cost monolithic optoelectronics-integrated EDWAs and/or light sources for both civilian and military applications.

Erbium Properties

Figure 1:
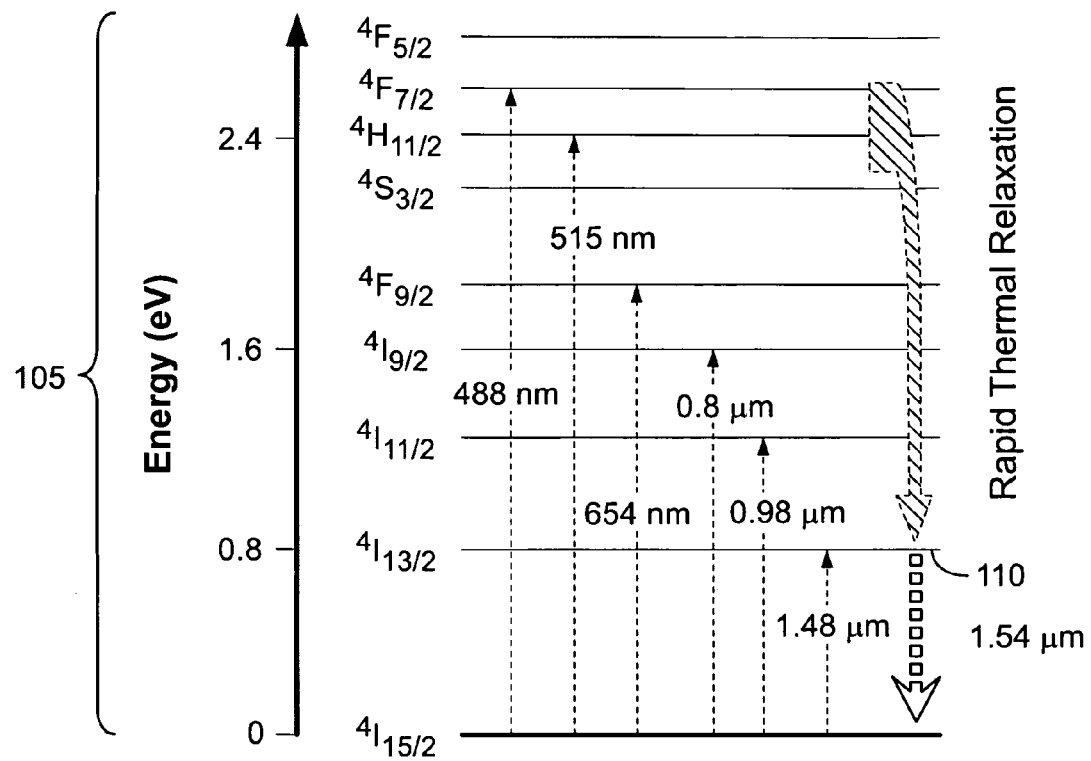
FIG. 1 is an example energy level diagram for trivalent ions of Erbium.

Erbium (Er) is a rare earth element belonging to the group of Lanthanides, and is often times studied due to its 1.54 μm optical transitions occurring at the minimum attenuation window of standard silica optical fiber. The optical properties of trivalently ionized Er result from their electronic configuration of $[Xe]-4f^{11}$. The $Er^{3+}$ has an incompletely filled $4f$-shell, allowing for different electronic configurations with different energies due to spin-spin and spin-orbit interactions, resulting in energy levels 105 of free $Er^{3+}$ ions, as shown schematically in FIG. 1. The energy levels 105 are labeled using a Russell-Saunders notation. Radiative transitions between most of these energy levels 105 are parity forbidden for free $Er^{3+}$ ions. However, when $Er^{3+}$ is incorporated in a solid, the local electromagnetic field from surrounding material perturbs the $4f$ wave functions. This has at least two notable consequences. First, the host material may introduce an odd-parity character in the $Er^{3+}$ $4f$ functions, thereby making radiative transitions weakly allowed. Possible transitions relevant for pumping optical amplifiers are also indicated in FIG. 1. Second, the host material may cause Stark-splitting of the different energy levels 105, resulting in a broadening of the optical transitions. Radiative transitions may be weakly allowed, thus the cross sections of absorption and emission may, consequently, be very small (typically on the order of $10-21$ $cm^2$), and the radiative lifetimes of the excited states may be long (up to several milliseconds). When Er is excited to a higher lying state, it may rapidly relax to lower energy levels via multi-phonon emission, resulting in typical excited sate lifetimes ranging from 1 nanosecond (ns) to 100 microseconds (μs). At the $^4I_{13/2}$ level 110, this multi-phonon relaxation is unlikely because of a large transition energy (e.g., 0.8 eV). Therefore, lifetimes at this energy level may be much longer than the other higher levels, which could be up to approximately 15 milliseconds (ms) (depending on host materials and Er concentrations).

Figure 2:
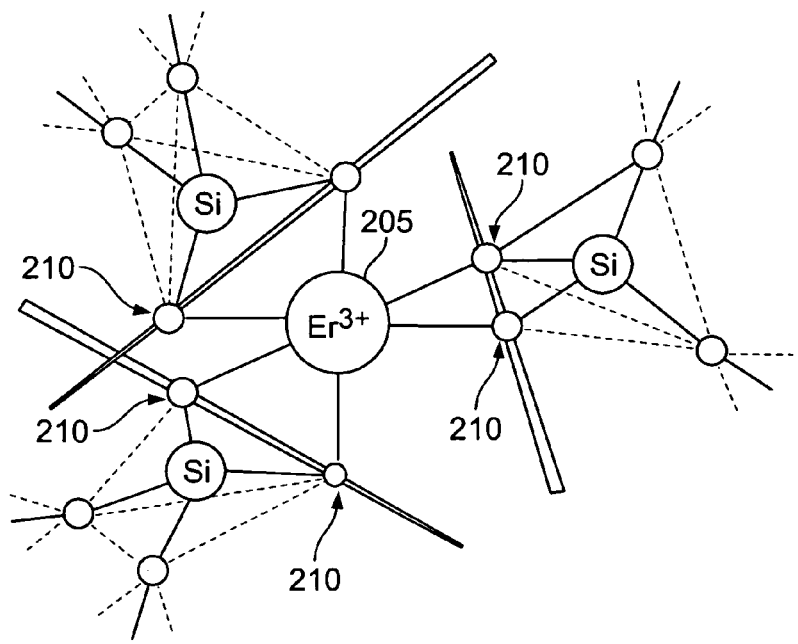
FIG. 2 illustrates example incorporation of an $Er^{3+}$ ion into a silica matrix.
Figure 3:
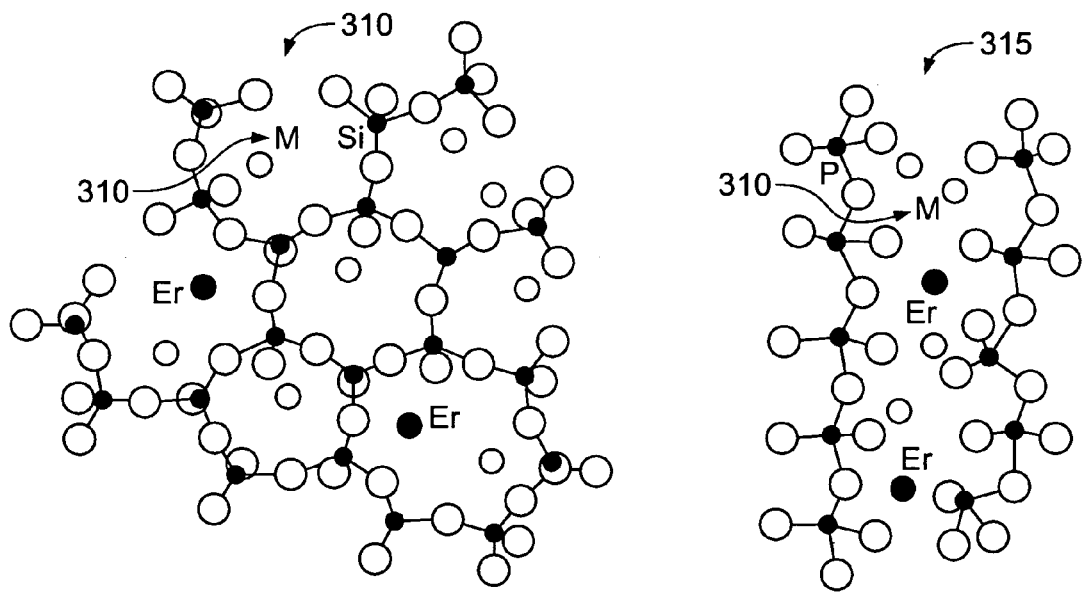
FIG. 3 illustrates example Er sites in silica and phosphate glass structures.

In general, materials with ionic structures such as oxides, fluoride glasses or ionic crystals, are typically better Er hosts than covalent semiconductors. In particular, such ionic structures offer a high Er solubility in the solid phase for minimum clustering and segregation. In the oxide glass matrix, $Er^{3+}$ ions 205 are believed to be bound to non-bridging oxygen atoms 210, as shown schematically in FIG. 2. To enhance a fraction of non-bridging oxygen, glass network modifiers, such as alkali elements, are added to the glass matrix to open chain-structures, resulting in multi-component glasses. FIG. 3 illustrates one possible placements of $Er^{3+}$ in these glass structures. Modifier ions 305 are indicated by the symbol "M." A silica glass structure 310 is on the left and a phosphate glass structure 315 is on the right. Aluminum oxides, known for larger inhomogeneous broadening, may also be added to glass matrixes as network modifiers for both higher Er solubility and broadband emission.

In addition to the solubility and fluorescence line shape, the excited state absorption (ESA) may be substantially affected by the host composition. This competing absorption phenomenon may seriously diminish the efficiency of an Er-doped active device. When changing from a germano-silica host to an alumino-silica host, a decrease in an excited state absorption for Er-doped fibers may occur, thereby demonstrating the importance of host selection for Er-doped waveguide amplifier and/or laser applications.

Figure 4:
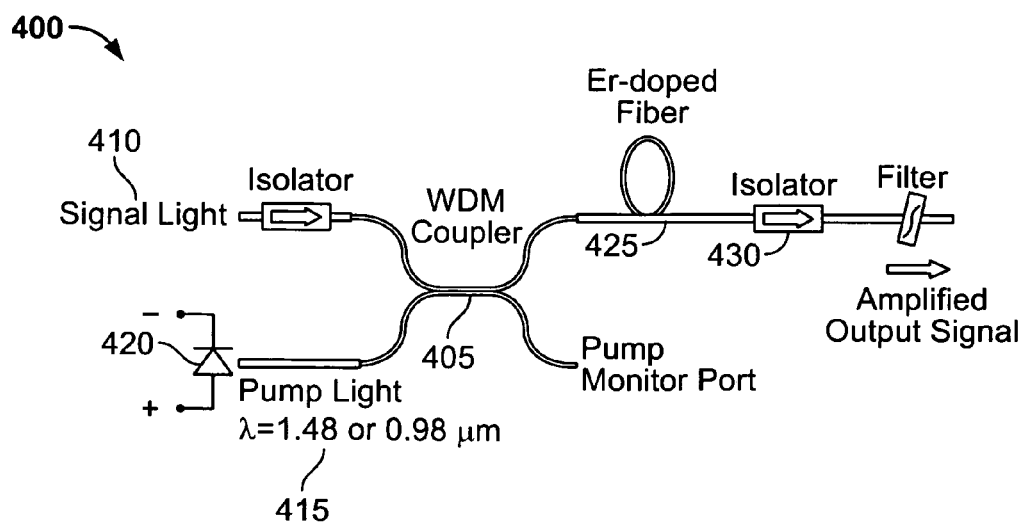
FIG. 4 is an example schematic of an Er-doped fiber amplifier setup.

EDFAs typically participate in an important role for long haul networks, allowing optical signals to be transmitted over very long distances without the need for signal regeneration, particularly in dense wavelength division multiplexing (DWDM) systems. FIG. 4 illustrates a diagram of the basic operation of an example EDFA system 400. In the illustrated example, a coupler 405 combines an input signal 410 at a wavelength of 1.5 μm with pump light 415 ($\lambda$=980 or 1480 nm) from diode lasers 420. As the gain media, an Er-doped fiber 425 can traverse several to tens of meters until it passes through an isolator 430. The Er concentration is usually from hundreds of parts-per-million (ppm) to several weight percent, depending on the glass host selection.

Figure 5:
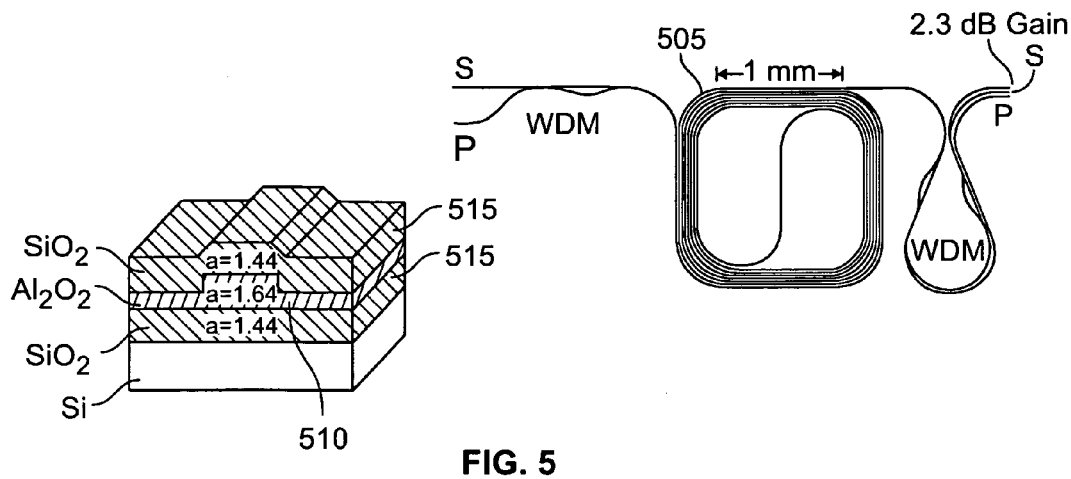
FIG. 5 illustrates an example planar integrated Er-doped waveguide amplifier on a Si substrate.

Waveguide amplifiers based on high concentration Er-doped oxides and/or glasses have been integrated with passive components, such as pump and signal WDM couplers. As seen in FIG. 5, a net gain of 2.3 dB has been achieved from a spiraled 4 cm long waveguide 505 using Er-doped $Al_2O_3$ as the core 510 and $SiO_2$ as cladding layers 515. The lasers required to optically pump active $Er^{3+}$ ions have previously been externally coupled to the Er-doped waveguides due to the incompatibility of laser materials with the Si substrates and host materials currently used for EDWA applications. This adds to both the size and complexity of an integrated system, thereby increasing its cost. As a result, III-V compound semiconductors, on which many diode lasers and detectors are built, may be a more promising platform for integration because the Er-doped native oxide waveguide can be fabricated with an on-chip pump and signal laser, detector, and potentially other optoelectronics integrated circuit (OIC) functionality via simple and conventional semiconductor planar processing techniques. Table 1 (below) lists some successful EDWAs developed and their selected performance parameters.

TABLE 1

| Host materials | P-doped SiO2 | Soda-lime silicate | Al2O3 | Yb-codoped phosphate | Y2O3 | P2O5/Al2O3/Na2O/La2O3 |
|---|---|---|---|---|---|---|
| Erbium concentration ($10^{20}$ cm$^{-3}$) | 0.4 | 0.7 | 2.7 | 16 | 1.3 | 5.3 |
| Gain (dB/cm) | 0.6 | 1.1 | 0.6 | >1.8 | 1.4 | 4.1 |
| Pump $\lambda$ (nm) | 980 | 980 | 1480 | 983 | 1480 | 980 |

Crystal Growth

Figure 6:
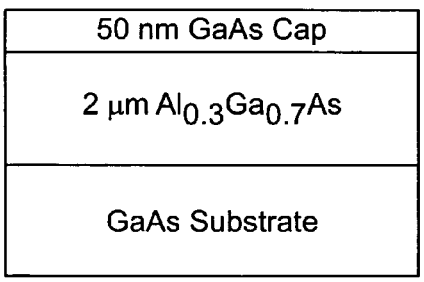
FIG. 6 illustrates example crystal structures of materials for host optimization.
Figure 6:
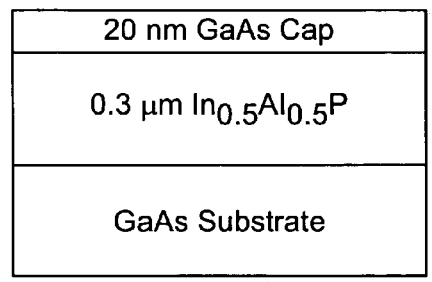

The example materials employed herein are grown by metal organic chemical vapor deposition (MOCVD) on GaAs substrates. It will be appreciated, however, that other methods of growing the example material may be employed as desired. For the native oxide host optimization, Erbium ions are not incorporated during the crystal growth despite a possibility of a more uniform doping than is typically possible via the ion implantation method. Such results are typically due to their limited solubility in semiconductors, which is about $7 \times 10^{17}$ cm$^{-3}$ in GaAs at 580° C. FIG. 6 illustrates crystal structures 600 of example un-doped materials. The wafers used for the low loss AlGaAs native oxide waveguide are described below.

Wet Oxidation

Figure 7:
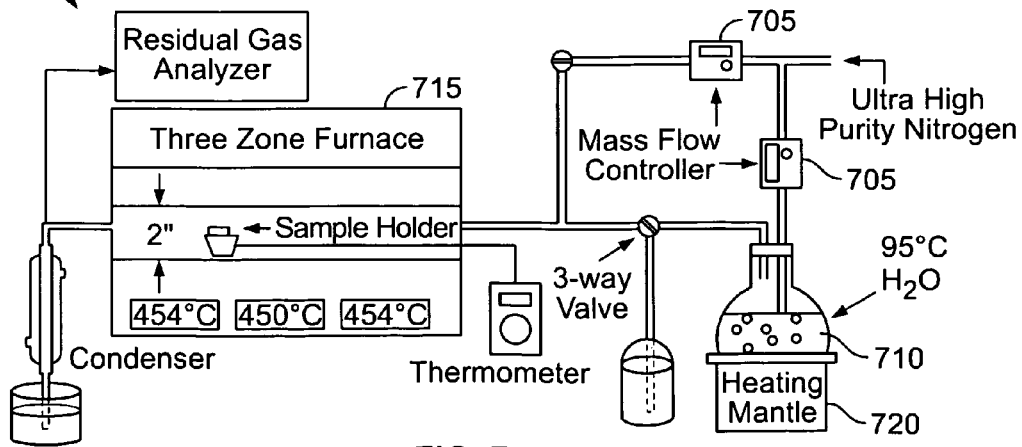
FIG. 7 is a schematic of an example oxidation furnace system.

In the illustrated examples described herein, thermal oxidation is performed using a conventional wet oxidation process for III-V compound semiconductors to convert the AlGaAs and InAlP to amorphous glass oxide structures. These example oxides provide both a relatively high Er solubility and low absorption loss due to the wider band gap of native oxides (optically passive). The schematic of the example oxidation system 700 is shown in FIG. 7 and includes mass flow controllers 705, a water vapor source 710, and a three-zone 2-inch-diameter tube furnace 715. Before the example wet oxidation process, the samples are first cleaned in acetone and isopropanol solvents, followed by the removal of any surface oxides with $HCl:H_2O$ (1:4) and a de-ionized (DI) water rinse. The example GaAs cap layers are selectively removed by wet chemical etching in citric acid: $H_2O_2$ (4:1), then the samples are immediately placed in the tube furnace to avoid oxidation in the air. During the example wet oxidation process, the steam is supplied by bubbling $N_2$ with a flow rate of approximately 0.68 liters/minute (l/min) through a 2 l flask of DI water, which is maintained at 95° C. through a heating mantle 720 having a temperature controller. All the metal tubes through which the water vapor passes are heated to 105° C. to avoid condensation.

Erbium Doping and Annealing

For both AlGaAs and InAlP native oxide samples, the example Er incorporation is performed via ion implantation (either before or after the wet oxidation process) by using doubly ionized $Er^{2+}$ as the source at a potential of 150 KV with a dose of $10^{15}$ cm$^{-2}$. To avoid channeling effects, samples may be tilted at 7° from the normal of the sample surface. Using a Monte Carlo program (TRIM98), the simulated implantation profiles for both AlGaAs and InAlP samples are listed in Table 2 below.

TABLE 2

| | $Al_{0.3}Ga_{0.7}As$ $Er^{2+}$ (300 keV) into Semi | $Al_{0.3}Ga_{0.7}As$ $Er^{2+}$ (300 keV) into Oxide | $In_{0.5}Al_{0.5}P$ $Er^{2+}$ (300 keV) into Semi | $In_{0.5}Al_{0.5}P$ $Er^{2+}$ (300 keV) into Oxide | $In_{0.5}Al_{0.5}P$ $Er^{+}$ (190 keV) Into Oxide |
|---|---|---|---|---|---|
| Average Range (Å) | 703 | 809 | 608 | 955 | 660 |
| Average Straggle (Å) | 268 | 238 | 210 | 280 | 203 |
| Peak Concentration (cm$^{-3}$) | $1.4 \times 10^{20}$ | $1.6 \times 10^{20}$ | $1.6 \times 10^{20}$ | $1.45 \times 10^{20}$ | $1.98 \times 10^{20}$ |
| Mass Density (g/cm$^{-3}$) | 4.825 | 3.55 | 5.374 | 3.13 | 3.13 |

The mass density of the example $Al_{0.3}Ga_{0.7}As$ native oxides are calculated based on the element concentrations and atomic densities obtained from these native oxides by Rutherford backward scattering (RBS) and hydrogen forward scattering (HFS) studies. For InAlP native oxides, the mass density is estimated to be 2.4 g/cm³ based on the atomic concentrations of elements from X-ray photoelectron spectroscopy profiles (Al—In—P~12%, O~64%), together with the consideration of the volume increase after wet oxidation, which is very close to the mass density value of 2.331 g/cm³ given by TRIM98. Post-annealing is performed using a rapid thermal processor (RTP) system at temperature ranging from 500-800° C. To suppress the possible As out-diffusion from the dissociation of the GaAs substrate at high temperatures, the holding time at the peak temperature may be set to zero in some experiments (referred to as "spike" annealing in this example).

Optical Characterization

Figure 8:
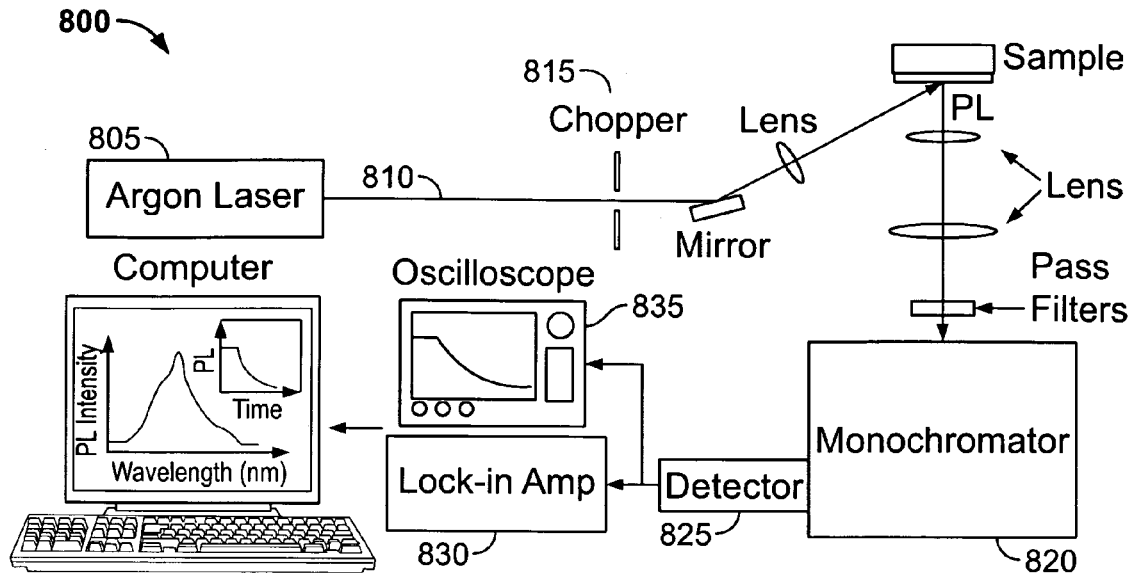
FIG. 8 is a schematic of an example photoluminescence characterization system.

Photoluminescence spectroscopy measurements may be used to characterize the optical properties of the example Er-doped native oxides described herein. FIG. 8 illustrates a schematic of an example test setup 800. At room temperature, the photoluminescence measurements are performed by resonantly exciting $Er^{3+}$ from the ground energy level $^4I_{15/2}$ to the $^4F_{7/2}$ level with an Argon ion laser 805 (488 nm line). In the illustrated example, a continuous wave (CW) pump beam 810 is mechanically chopped by a chopper (e.g., a chopper wheel) 815 at a frequency ranging from 10 to 20 Hz, depending on the lifetime of the fluorescence. The luminescence is spectrally analyzed with a 0.5 meter grating monochromator 820 and detected by a thermoelectrically cooled InGaAs detector 825 with a built-in pre-amplifier. To increase the signal to noise ratio (SNR), the detector 825 may be cooled to approximately −30° C. and a lock-in amplifier 830 may be used for synchronous detection of the PL signal.

Fluorescence decay measurements may be performed by recording the PL intensity curves using a digital oscilloscope 835 after the pump light is mechanically switched off by the chopper wheel 815. In the illustrated example, increasing the SNR is achieved by setting the monochromator 820 to a wavelength where the PL has a maximum intensity (e.g., $\lambda$=1.531 µm) and the decay curves are also averaged using the oscilloscope 835. The average lifetime of the $Er^{3+}$ at the first excited state of $^4I_{13/2}$ may be obtained by fitting the exponential decay curves with the function of $I=I_0 \exp(-t/\tau)$, where $I_0$ is the initial PL intensity (right after the pump light is switched off at t=0), and $\tau$ is the luminescence lifetime. The example system has a delay of <0.1 ms, which may be obtained by measuring the decay of the pump signal reflected from the un-implanted samples at 1464 nm (which is the $3^{rd}$ diffraction order of the monochromator grating).

Figure 9:
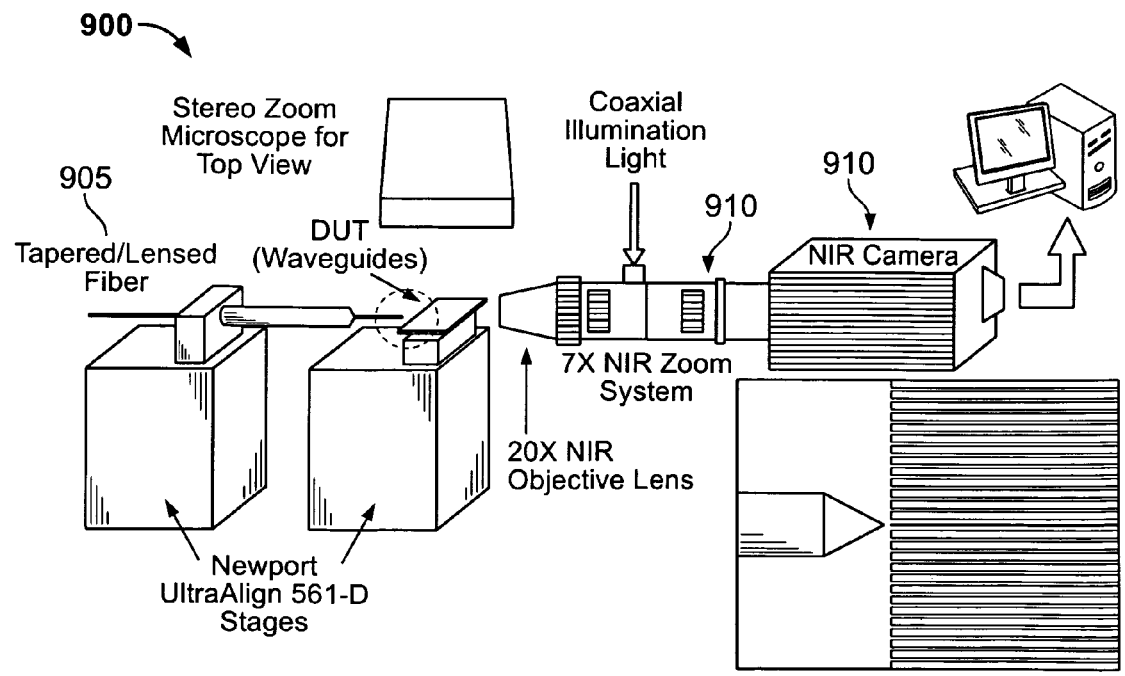
FIG. 9 is a schematic of an example waveguide characterization system.

The characterization of oxide waveguides can be challenging particularly due to the required alignment accuracies involved. As such, several improvements may be made to an example waveguide testbed system 900 shown in FIG. 9. In particular, the example testbed system 900 of FIG. 9 includes tapered lensed fibers 905 to replace bulk lenses for input coupling, and a new near infrared (NIR) video zoom system 910 for enhanced waveguide imaging. Advanced loss measurements may be performed in this system 900, shown in the schematic of FIG. 9, as well as determination of near field mode profile(s).

Wet oxides of AlGaAs and InAlP as an Erbium Host

The example AlGaAs native oxides described herein, as an amorphous solid solution of $(Al_xGa_{1-x})_2O_3$, are a viable host for Er. Room temperature PL studies on these Er-doped native oxides showed a wider luminescence bandwidth centered at 1.53 µm and a higher Er solubility compared to that from the un-oxidized Er-doped semiconductor itself. Further detailed studies on these example Er-doped AlGaAs native oxides identified that there are at least three types of complexes which quench the PL (i.e. cause non-radiative de-excitation processes).

The first complex includes Er—Er pairs or clusters, where two closely spaced excited $Er^{3+}$ ions can transfer the energy from one to the other and raise the "acceptor" ion to higher energy levels while the "donor" ion's electron returns to the ground level. As a result, both ions become unavailable for stimulated emission of photons for light amplification at 1.54 µm. This mechanism is known as the co-operative upconversion effect, and may seriously limit the performance of a waveguide amplifier or laser where the waveguide has to be heavily doped with a large amount of Er to compensate for both the small optical transition cross sections of Er and the waveguide length limit of a few to tens of cm practical with the planar optical integration.

A second quenching complex includes hydroxyl (OH) groups in the oxide films, for which the $3^{rd}$ overtone of the vibration mode overlaps the emission window of $Er^{3+}$. However, the "OH-quenching" complexes are not intrinsic to the wet oxidation process. Instead, they manifest themselves primarily from the moisture absorption after oxidation due to the porous nature of AlGaAs wet oxides, which may be addressed through proper packaging following a fabrication process.

Figure 10:
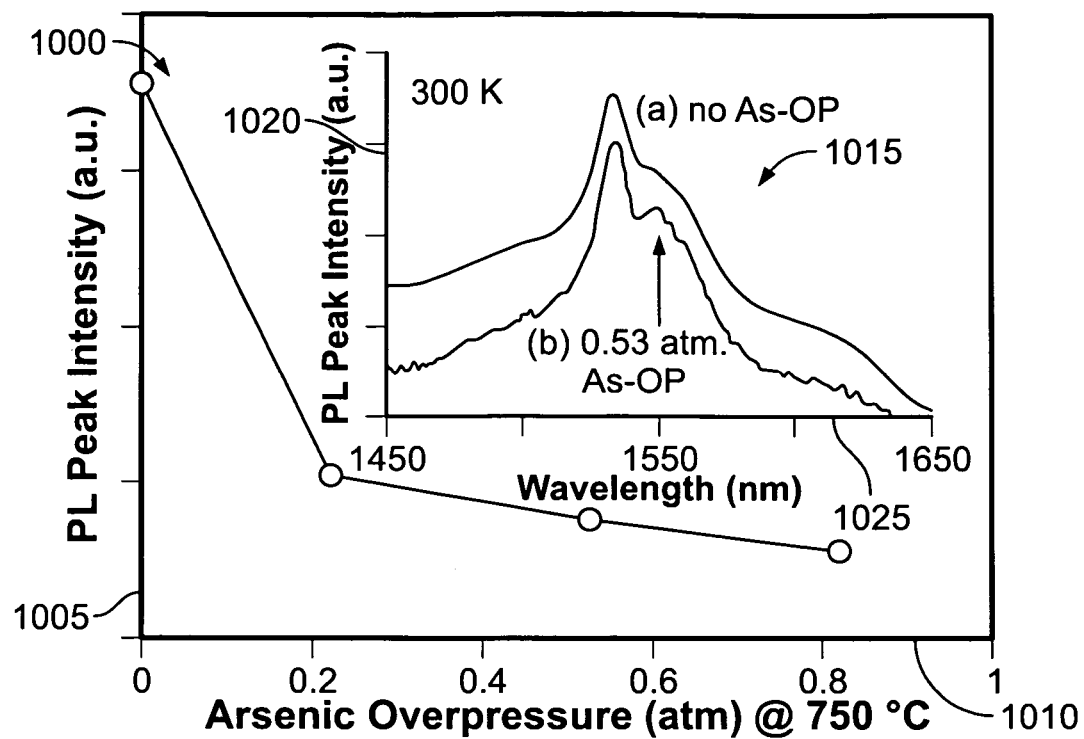
FIG. 10 is an example plot of photoluminescence peak intensity versus Arsenic overpressure for example AlGaAs native oxides.

A third photoluminescence quenching mechanism is called "As-quenching," which is typically attributed to the possible formation of ErAs complexes or precipitates. This Er—As related quenching mechanism is also observed in heavily Er-doped GaAs grown by molecular beam epitaxy (MBE). The existence of Er—As related quenching in AlGaAs native oxides is supported through As-overpressure annealing studies, as shown in FIG. 10. FIG. 10 illustrates an example plot 1000 of PL Peak Intensity 1005 versus Arsenic Overpressure 1010, and an example plot 1015 of PL Peak intensity 1020 versus wavelength 1025 with and without As-overpressure. As described below, results are shown to indicate that these quenching complexes may be nearly completely eliminated through a deliberate change in the order of processing steps.

Erbium-Doped AlGaAs Native Oxides by Post Oxidation

The widely accepted chemical reactions for the wet oxidation of AlAs (extendable to AlGaAs) are shown in Equations (1)-(3) as:

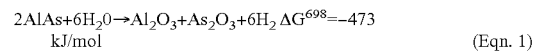
$2AlAs+6H_2O \rightarrow Al_2O_3+As_2O_3+6H_2 \; \Delta G^{698}=-473$ kJ/mol (Eqn. 1)

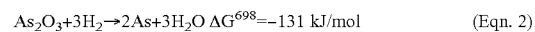
$As_2O_3+3H_2 \rightarrow 2As+3H_2O \; \Delta G^{698}=-131$ kJ/mol (Eqn. 2)

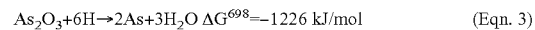
$As_2O_3+6H \rightarrow 2As+3H_2O \; \Delta G^{698}=-1226$ kJ/mol (Eqn. 3)

Noting that As is a byproduct of these reactions, it is clear that Er-doped AlGaAs native oxides may contain a large amount of ErAs PL-quenching complexes if Er is doped into the crystal before oxidation. Accordingly, because most As (e.g., greater than approximately 98%) leaves the crystal during the wet oxidation of AlGaAs, this limitation may be largely overcome by post-oxidation Er implantation. As described below, elimination of ErAs complex formations is nearly eliminated through improved PL signal intensities and fluorescence lifetimes.

Figure 11:
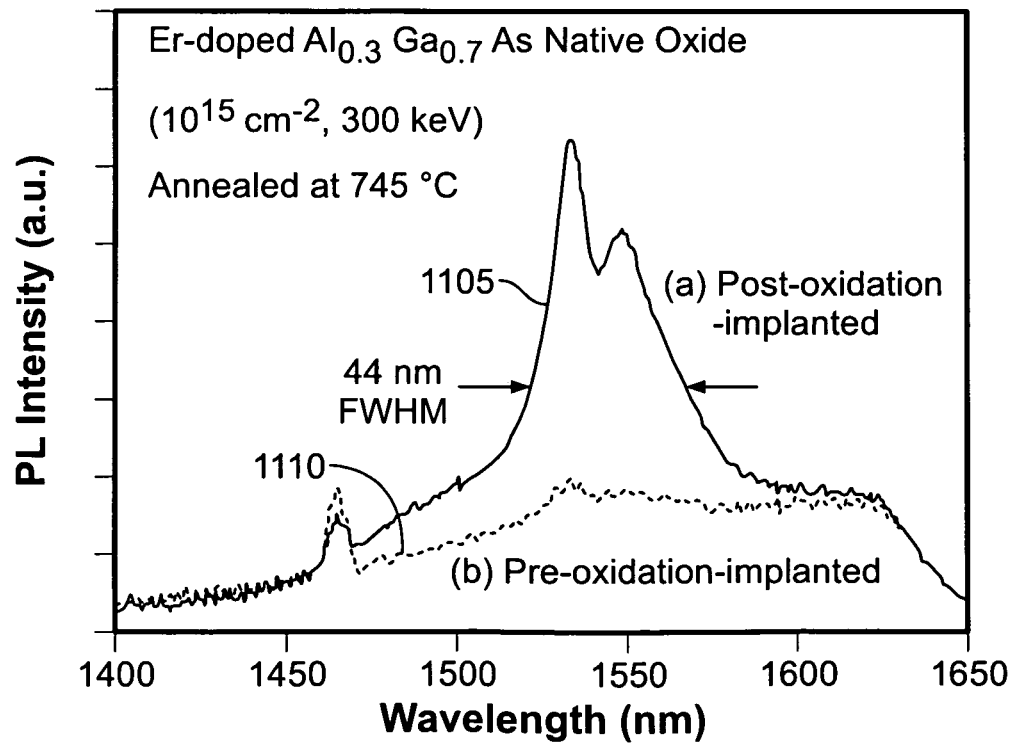
FIG. 11 is an example plot of photoluminescence intensity versus wavelength for pre and post-oxidized Er-implanted films.

As shown in FIG. 11, room temperature PL from the post-oxidation implanted sample shows a broad emission having a 44 nm full width at half maximum (FWHM) 1105. This is much stronger than that from an example pre-oxidation-implanted sample 1110 (by a factor of 3.3 at the peak wavelength of 1.53 μm) after both samples are spike-annealed at 745° C. in the RTP system in $N_2$ ambient. Such differences may be attributed to the near complete elimination of ErAs complexes in the post-oxidation-implanted samples. For the example pre-oxidation implanted sample 1110, arsenic released during wet oxidation through the chemical reactions in Equations (1)-(3) may bond to Er ions implanted previously and form ErAs complexes and precipitate as the arsenic is leaving the crystal. This process may be virtually eliminated in post-oxidation-implanted samples because the wet oxidation is performed while Er ions are absent (before implantation), resulting in a larger amount of optically active $Er^{3+}$ ions and, thus, enhanced PL performance.

Figure 12:
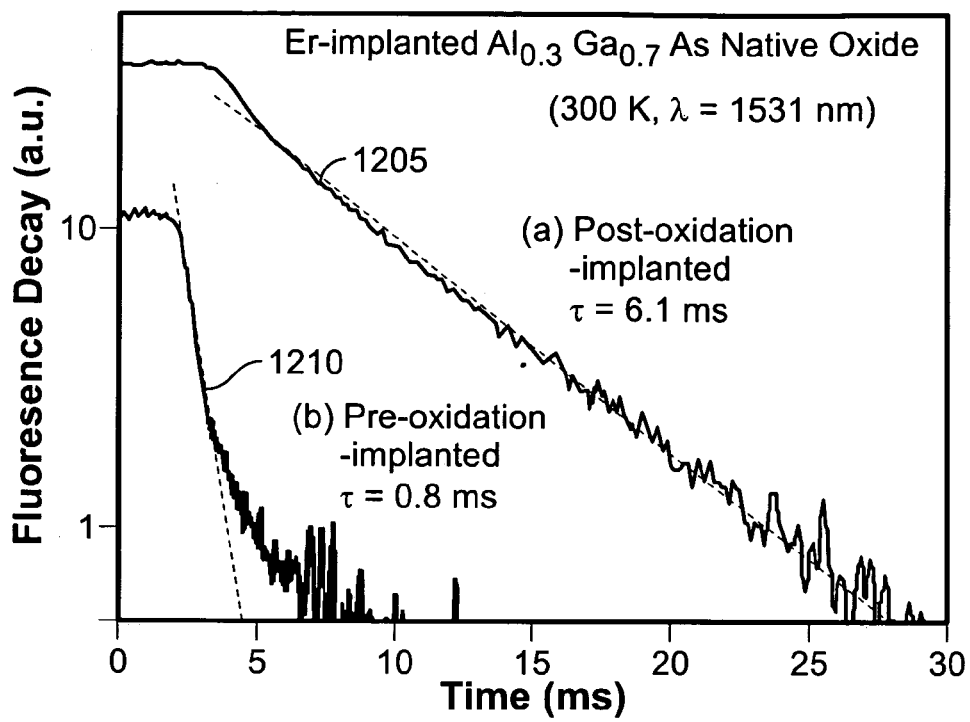
FIG. 12 is an example plot of fluorescence decay versus time for Er-implanted AlGaAs native oxides for pre and post-oxidized samples.

This significant improvement by post-oxidation implantation may be further characterized through the substantial increase of the Er $^4I_{13/2}$ level luminescence lifetime as compared to the pre-oxidation implanted sample. As seen in FIG. 12, an example post-oxidation-implanted sample annealed at 745° C. 1205 shows a single exponential decay with a relatively long 6.1 ms lifetime, suggesting that most optically active $Er^{3+}$ ions may be spatially separated and few Er clusters or ErAs precipitates are formed in this native oxide. Although the fluorescence from the pre-oxidation-implanted sample 1210 shows a slightly non-exponential decay behavior after the pump power is cut-off, the fast decay is dominant and has a lifetime of only 0.8 ms, showing clustering effects in this Er-doped oxide, which could arise from the ErAs complex and precipitates through the cooperative upconversion mechanism as described above. Another possible mechanism that may cause Er clustering in the pre-oxidation-implanted sample may occur via the transportation of Er ions during the wet oxidation process. Such a process forms non-optically active Er—Er pairs, thereby reducing the lifetime, which is eliminated in the pre-oxidation-implanted samples because the wet oxidation is completed prior to the Er implantation.

Figure 13:
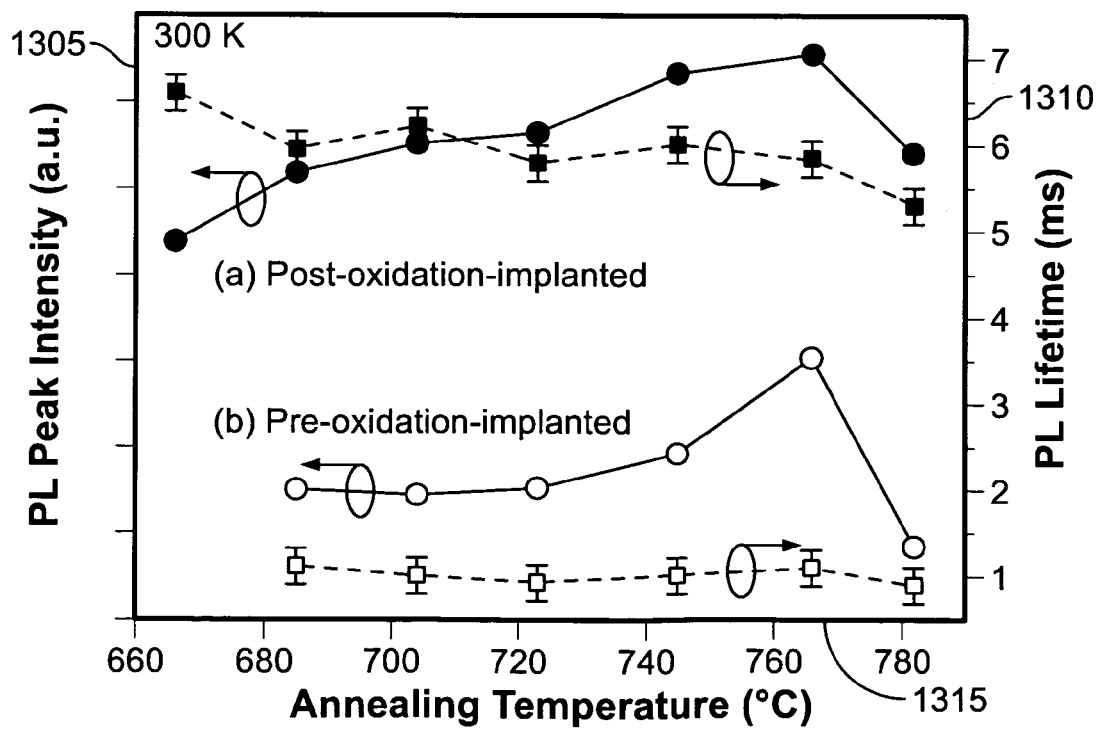
FIG. 13 is an example plot of photoluminescence peak intensity versus annealing temperature and photoluminescence lifetime versus annealing temperature for example Er samples for pre and post-oxidization-implantation.

To ensure accurate comparison and further improve the PL from the post-oxidation implanted samples, the dependence of PL on annealing temperature has also been explored for both pre and post-oxidation-implanted samples. FIG. 13 illustrates example PL intensity 1305 and lifetime results 1310 versus annealing temperature 1315. In the illustrated example of FIG. 13, all PL measurements are finished in the same ambient conditions within 24 hours of annealing to minimize effects of any moisture adsorption by the porous AlGaAs native oxides and associated quenching due to hydroxyl (OH) groups. All example samples are "spike" annealed in $N_2$ using RTP and optically characterized at room temperature (300 K). The example lifetime measurements are at the wavelength of 1.531 μm, which is the position of peak PL intensity. Although at a higher annealing temperature of ~766° C., the pre-oxidation-implanted sample shows a stronger PL than at 745° C., the overall relative performance improvement (~3× PL intensity increase and ~7× lifetime increase) still holds. Error bars (~0.2 ms) on the PL lifetimes illustrate fitting errors. The changes in both PL intensity and lifetime may be complexly dependent on the fraction of activated Er ions and their local environment. Such changes may be affected by various possible processes happening during the annealing process, including Er activation, repair of implantation-induced defects, Er transportation, arsenic out-diffusion from the dissociation of GaAs substrate, and even possible phase changes or chemical reactions occurring at the high annealing temperature. As a tentative explanation, the large decrease of PL intensity when the samples are annealed at temperatures over ~770° C. may come from GaAs substrate dissociation which provides a large number of As quenching PL. The slow decrease of PL intensities with decreased annealing temperature (e.g., T<770° C.) may be due to the slow Er activation rate in a "spike" annealing process at lower temperature. The PL intensity may be primarily determined by the fraction of optically active $Er^{3+}$ ions, and less influenced by changes in their interactions with quenching mechanisms/centers that alter non-radiative decay rates. The relatively long (e.g., 6~7 ms) lifetimes at a high Er peak concentration of $1.6\times10^{20}$ $cm^{-3}$, which have been achieved from the post-oxidation-implanted samples, are very competitive to the values from other Er-doped host materials used in waveguide amplifiers at the same Er concentration levels.

Figure 14:
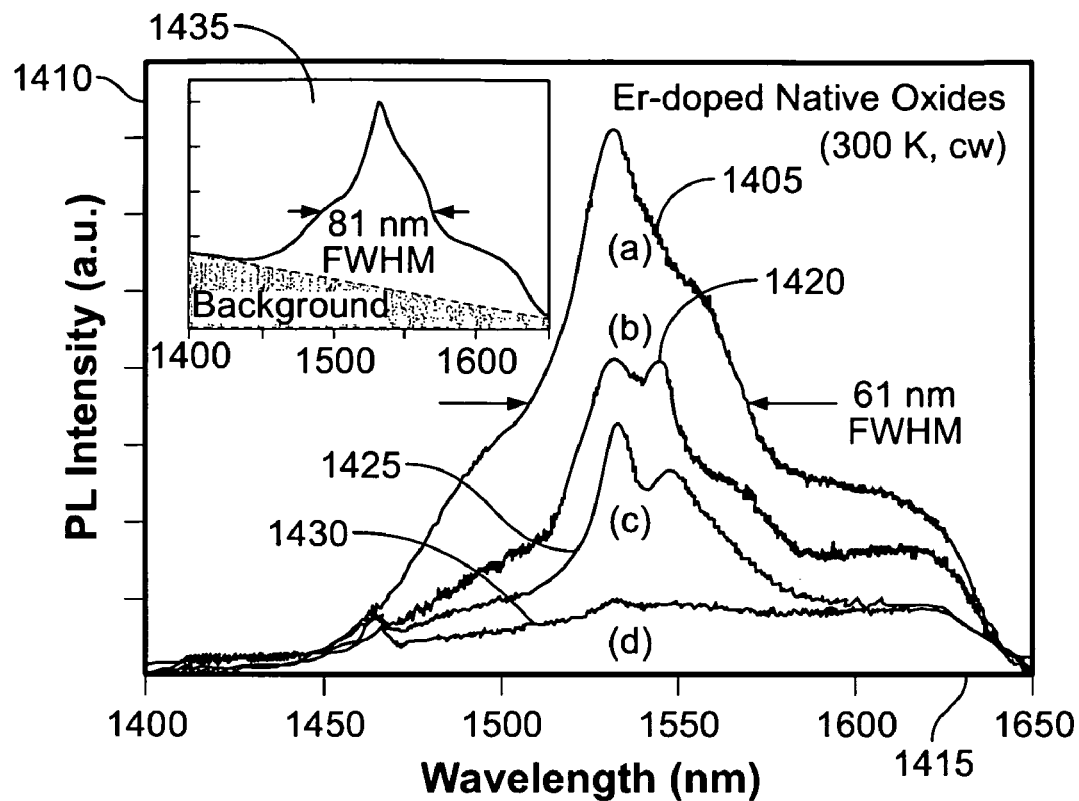
FIG. 14 is an example plot of photoluminescence intensity versus wavelength for Er-doped group III-V wet thermal native oxides.

The example wet thermal oxides of InAlP (lattice-matched to GaAs and As-free) are primarily an amorphous mixture of $Al_2O_3$ and $In_2O_3$ oxides and the phosphates $AlPO_4$ and $InPO_4$. Accordingly, the example wet thermal oxides of InAlP are an even better host as compared to oxidized AlGaAs, as shown in FIG. 14. FIG. 14 illustrates PL spectra 1400 (CW at 300 K) for example Er-doped ($10^{15}$ $cm^{-2}$, 300 keV ions) group III-V wet thermal native oxides. In the illustrated example, a plot 1405 of PL intensity 1410 versus wavelength 1415 for post-oxidation-doped $In_{0.5}Al_{0.5}P$ shows the highest PL intensity, while pre-oxidation-doped $In_{0.5}Al_{0.5}P$ 1420, post-oxidation-doped $Al_{0.3}Ga_{0.7}As$ 1425, and pre-oxidation-doped $Al_{0.3}Ga_{0.7}As$ 1430 show lower PL intensities. Bulk phosphate-based laser glasses are known to have a higher Er solubility, accommodating several weight percent concentrations of rare earth ions without clustering. Native oxides of InAlP have excellent electrical properties, suggesting a low density of defects that might form fluorescence-quenching recombination centers.

Yb-codoping is commonly used to increase the pump light absorption to enhance the population inversion required for stimulated emission. The absorption cross section of $Yb^{3+}$ at 980 nm is about an order of magnitude larger than that of $Er^{3+}$, and its absorption band extends over a wider wavelength region (between 850 and 1000 nm). The $Er^{3+}$ can quickly decay between $^4I_{11/2}$ to $^4I_{13/2}$ levels bridged by fewer phonons to minimize the energy back-transfer from $Er^{3+}$ to $Yb^{3+}$ at the $^4I_{11/2}$ level, thus because of the large phonon energy of the P—O bonds (e.g., approximately 1400 $cm^{-1}$), oxidized InAlP may also be a good candidate for Yb—Er co-doped waveguide amplifiers.

With a large fraction of $Al_2O_3$ and the absence of alkali ions, InAlP native oxides may possess better mechanical and chemical stabilities compared to commercial phosphate glasses. Together these properties make oxidized INAlP a very promising rare earth ion host, particularly for monolithic optoelectronics integration.

Returning to FIG. 14, a comparison is made of 300 K, CW photoluminescence spectra for example Er-doped InAlP and AlGaAs native oxides. To avoid overstating the Er emission bandwidth, the spectra of InAlP:Er oxides in example plots 1405 and 1420 (see (a) and (b)) were corrected to remove a spurious background signal from impurities in the semiconductor of this wafer not related to the Er luminescence or oxide, as shown in an inset 1435. The data of FIG. 14 illustrates that the strongest PL intensity is obtained from the example post-oxidation-doped InAlP oxide (see curve 1405), which has a peak intensity that is 1.7 times higher than that of the pre-oxidation-doped InAlP oxide (see curve 1420), and 2.2 times higher than that of the post-oxidation-doped AlGaAs oxide (see curve 1425).

Figure 15:
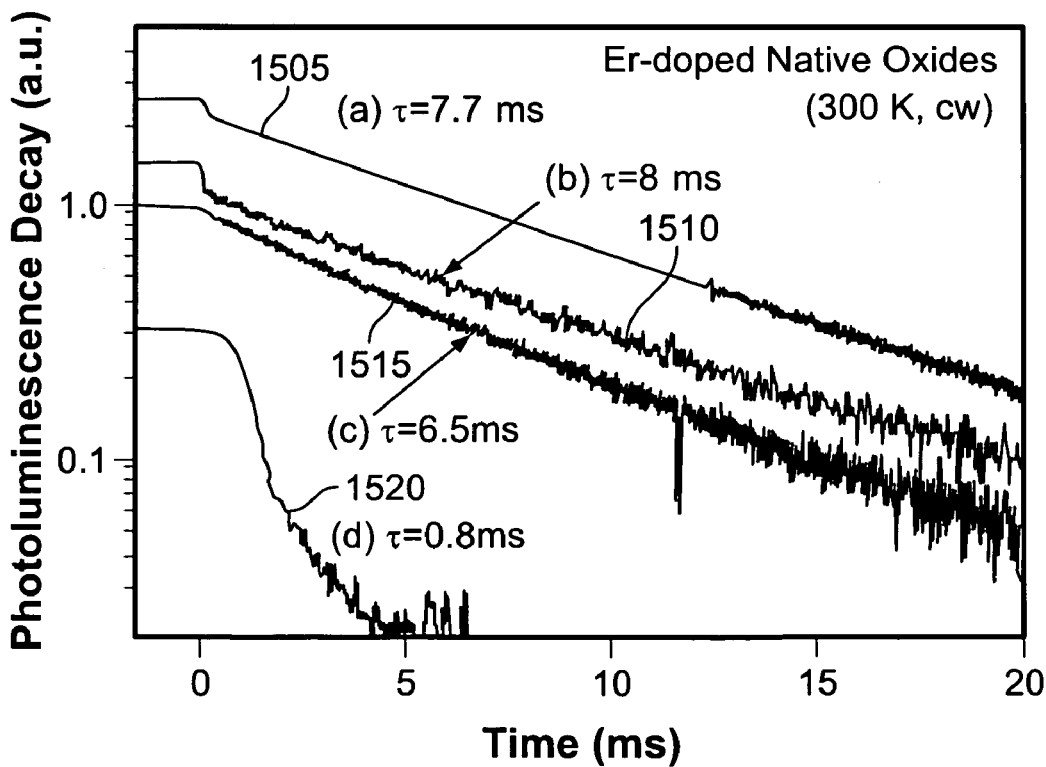
FIG. 15 is an example plot of photoluminescence decay versus time for samples from FIG. 14.

FIG. 15 illustrates a fluorescence decay for the spectra of FIG. 14. Single exponential fitting shows comparably long Er luminescence lifetimes of $\tau=7.7$ ms (see curve 1505) and 8.0 ms (see curve 1510) for the example post-oxidation and pre-oxidation-doped InAlP oxide, respectively. These results are significantly larger than the respective $\tau=6.5$ ms (see curve 1515) and 0.8 ms (see curve 1520) lifetimes for the post-oxidation and pre-oxidation-doped AlGaAs oxides. Additionally, the example InAlP oxides do not show significant performance degradation when doped before oxidation because of the As-free nature of the host and consequent avoidance of ErAs complex formation, which is at least one significant advantage of this system.

Another significant advantage of oxidized InAlP as a host for Er may be evident from the broad Er emission width (a host-dependent property) which enables broader gain bandwidths for potential amplifier applications. After subtracting the background, the example data of FIG. 14 still shows a very broad spectral emission width of 61 nm FWHM, which is much broader than the 44 nm FWHM of the example post-oxidation-doped AlGaAs oxide of the post-oxidation-doped $Al_{0.3}Ga_{0.7}As$ (see curve 1420). Moreover, the 61 nm FWHM width is considerably broader than values typical for various silicate oxide hosts as indicated in Table 3, shown below.

TABLE 3

| Er-doped Materials | FWHM (nm) |
|---|---|
| $SiO_2$ | 11 |
| Phosphosilicate glass | 25 |
| Sodalime silicate glass | 19 |
| $Al_2O_3$ | 55 |
| AlGaAs native oxide | 50 |
| $In_{0.47}Al_{0.53}P$ native Oxide | 61 |

Figure 16:
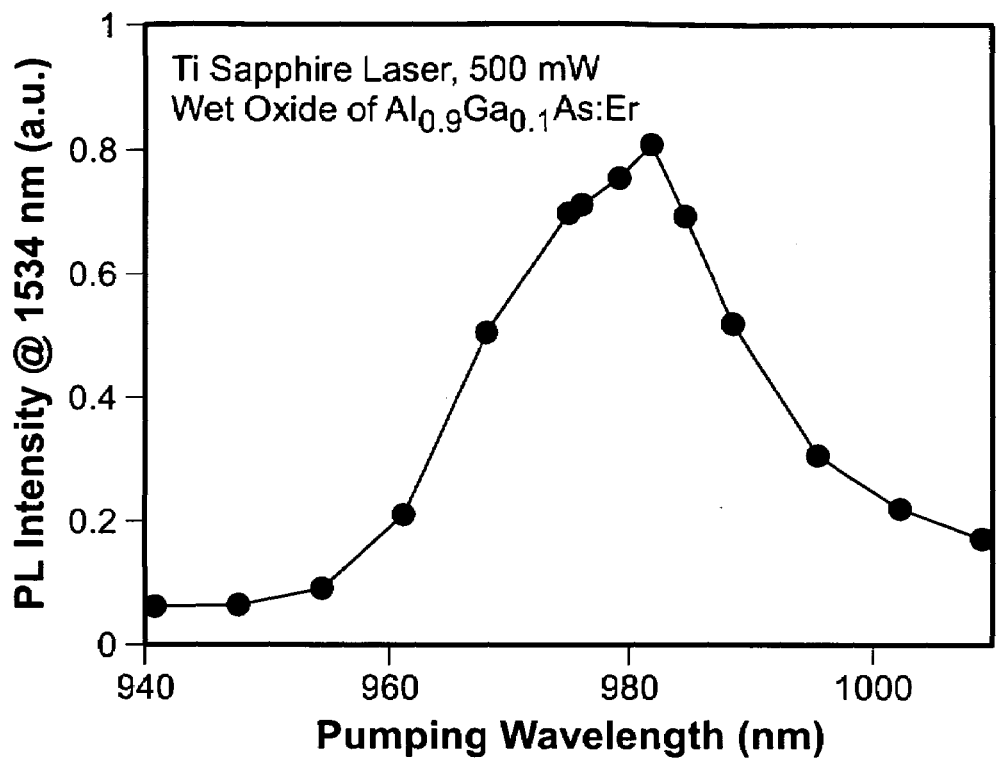
FIG. 16 is an example plot of photoluminescence intensity versus pumping wavelength for an example Er-doped AlGaAs oxide.
Figure 17:
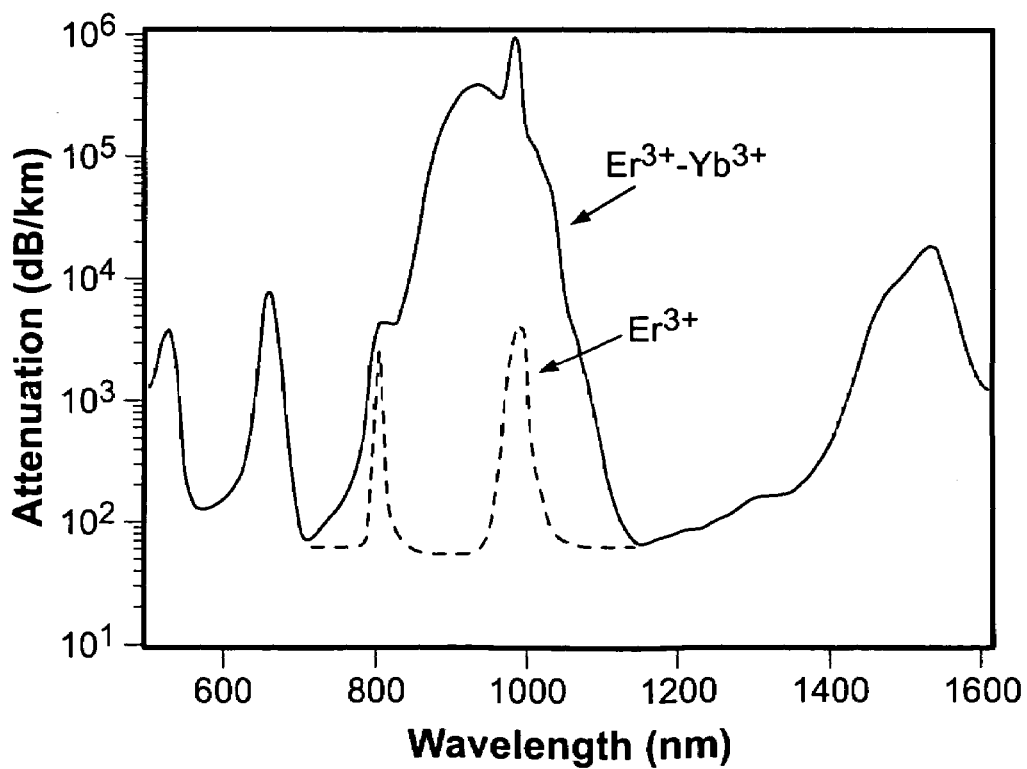
FIG. 17 is an example plot of attenuation versus wavelength for example oxides with $Er^{3+}$ with and without $Yb^{3+}$ codoping.

Due to various sensitization mechanisms (e.g., Al ion pairs), Er-doped III-V native oxides have a broad pumping band, which may significantly relax constraints on pump wavelength control. This is demonstrated by the PL excitation spectrum of FIG. 16 (top) for Er-doped wet oxides of $Al_{0.9}Ga_{0.1}As$, which shows a broad (e.g., ~20 nm FWHM) pump absorption band around 980 nm. With the large phonon energy of the P—O bonds (e.g., ~1400 $cm^{-1}$), oxidized InAlP is also a good candidate for Yb—Er co-doped waveguide amplifiers because the $Er^{3+}$ can quickly decay between $^4I_{11/2}$ to $^4I_{13/2}$ levels bridged by fewer phonons to minimize the energy back-transfer from $Er^{3+}$ to $Yb^{3+}$ at the $^4I_{11/2}$ level. FIG. 17 shows that $Yb^{3+}$ codoping enhances the absorption coefficient near the 980 nm pumping transition in aluminosilicate glass by more than two orders of magnitude. Additionally, such $Yb^{3+}$ codoping broadens the absorption width.

Grown from epitaxial layers lattice-matched to GaAs substrates, these example native oxides may offer a unique key advantage over other rare earth host materials in their potential for monolithic integration with active components, particularly pumping sources. Through conventional lattice-matched epitaxial growth, strained InGaAs quantum well heterostructure active regions (typically employed for 980 nm excitation of $Er^{3+}$ ions in optical amplifiers) may be incorporated on the same chip as the Er-doped planar waveguide amplifier device. Thermal budget restraints present in GaAs-based device processing emphasizes particular benefits in that these example Er-doped native oxides and pumping devices are successfully processed at temperatures below ~550° C. More specifically, the example InAlP oxides described herein are typically grown at 500° C. Additionally, the Er activation anneals do not require the very high temperatures found in many other Er host materials. As FIG. 13 illustrates, long luminescence lifetimes can be obtained even with annealing temperatures as low as 525° C.

Figure 18:
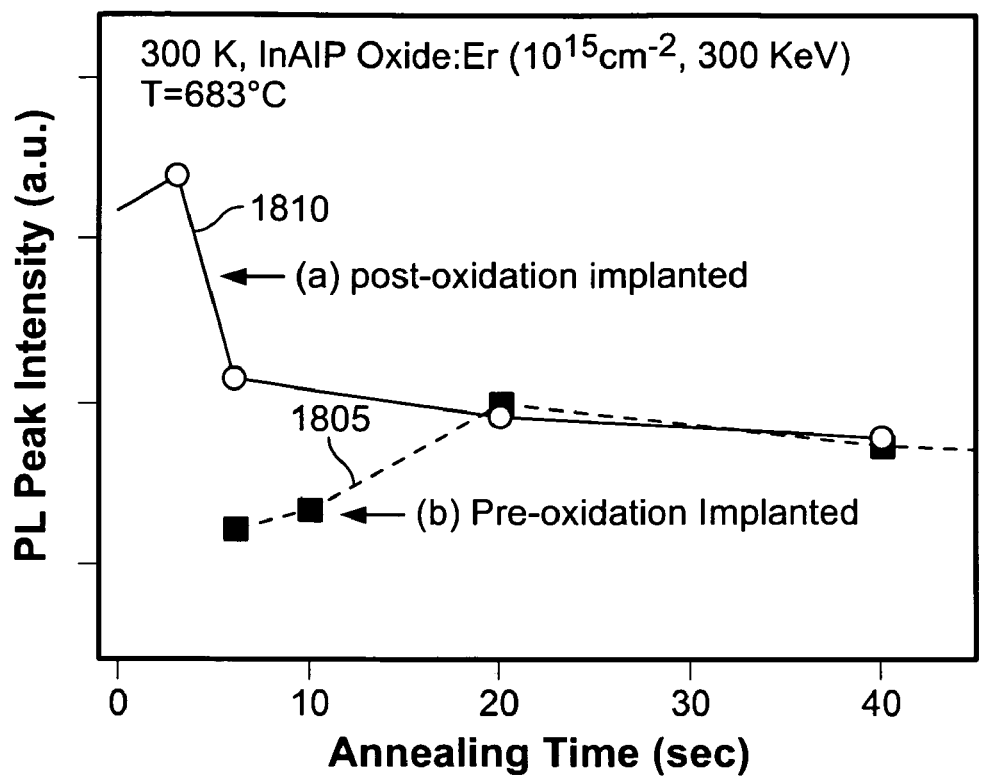
FIG. 18 is an example plot of photoluminescence peak intensity versus annealing time for example pre and post-oxidation implanted samples.
Figure 19:
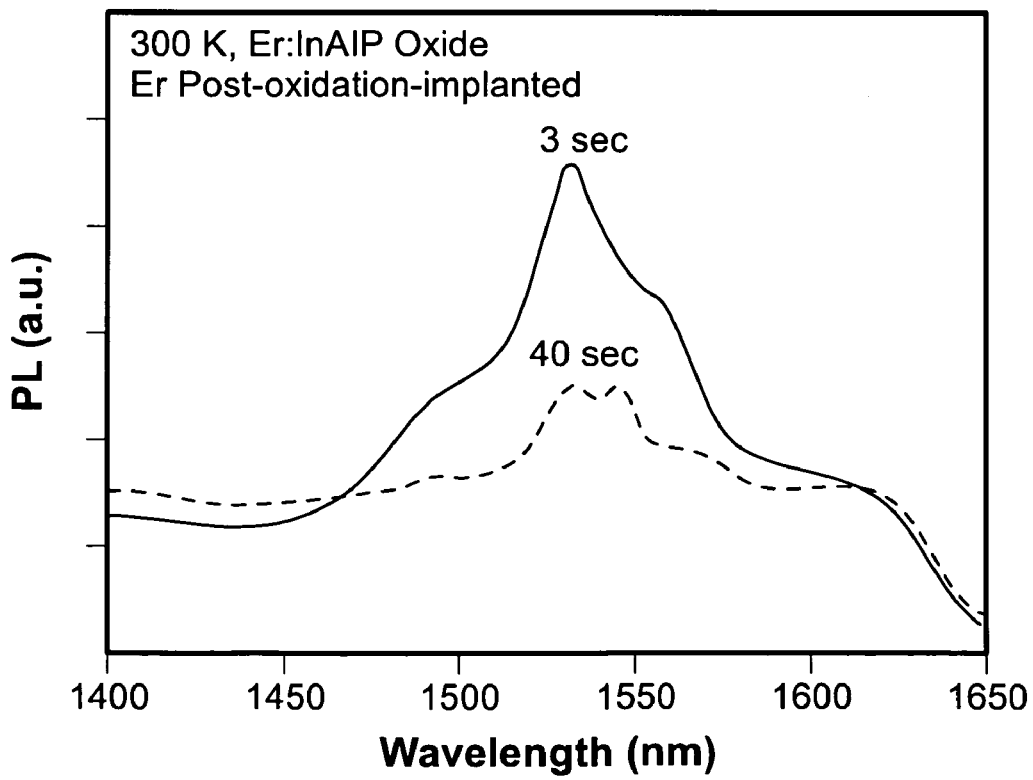
FIG. 19 is an example plot of photoluminescence versus wavelength for example pre and post-oxidation implanted samples.

FIG. 18 presents example data on the PL intensity dependence on the annealing time for both example pre-oxidation 1805 and post-oxidation 1810 implanted InAlP samples carried out at 683° C. In the illustrated example, a 3-second optimal annealing time for post-oxidation-implanted samples 1810 is shown, which is notably shorter than that of the pre-oxidation-implanted samples 1805 (e.g., approximately 20 sec). Such results indicate that less thermal energy is required for Er activation. FIG. 19 illustrates a spectral line shape change is also observed for the example post-oxidation-implanted samples when they are over-annealed, which may indicate a local environment change of Er ions in these example samples.

Figure 20:
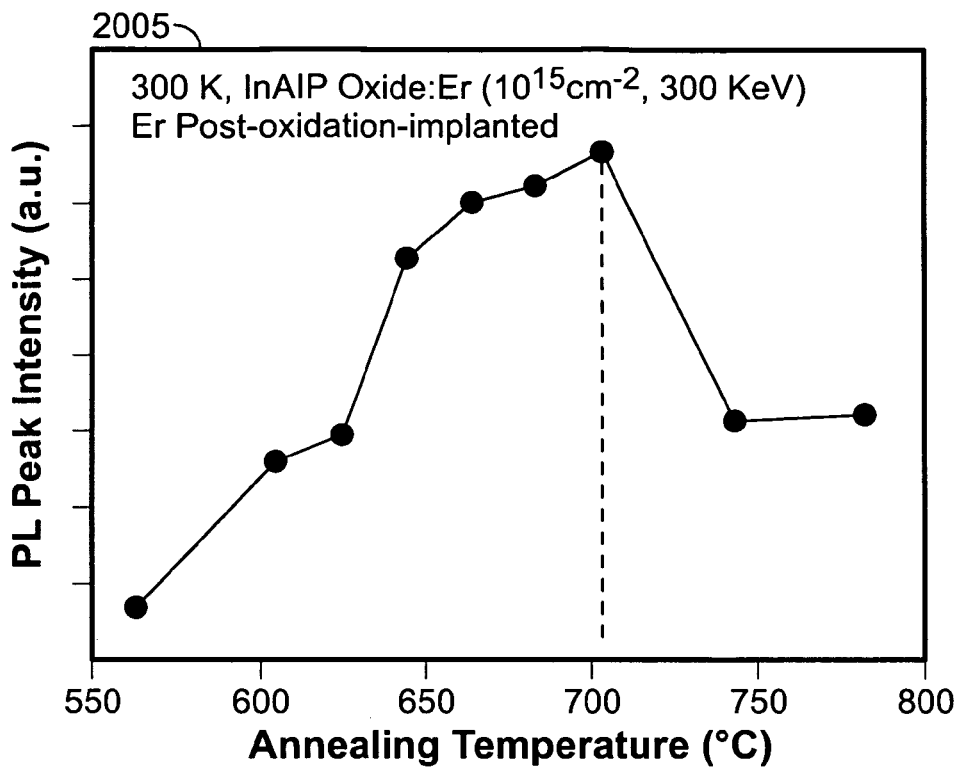
FIG. 20 is an example plot of photoluminescence peak intensity versus annealing temperature for example post-oxidation implanted samples.

To further improve the PL from the example post-implanted samples, the Er-implanted InAlP native oxide samples are spike annealed at various temperatures between 550 and 800° C., as shown in FIG. 20. Similar to the example Er-doped AlGaAs native oxide samples, an increase of the PL intensity 2005 with an increased annealing temperature is observed below 700° C., which may result from the slower Er activation rate at lower temperatures. When the example samples are spike annealed above 700° C., a rapid decrease of the PL intensity is also observed. This may come from either substrate dissociation, similar to the Er-doped AlGaAs native oxide samples shown above, or from a possible phase change in these phosphate rich oxide layers, similar to the glass transformation of $Na_3PO_4$ when heated above a certain temperature (e.g., approximately 400° C.). This results in polyphosphate chain structures that are typically not suitable for EDWA applications, as described above.

Notably, for both the example post and pre-oxidation-implanted samples, the PL lifetimes remain near 8 ms after RTP annealing over the entire temperature range of 550 to 800° C. (data shown below). Such results may indicate minimal Er clustering and suggest that even higher Er concentrations may be possible, which is particularly beneficial for increased EDWA gain.

Considering the importance of the thermal budget requirements present in GaAs based device processing, it is generally desirable that all of the processing steps associated with the integration of Er-doped native oxides and monolithically-integrated active pump devices, be performed at acceptable temperatures below ~550° C. Where required, higher temperature processes such as doping implant activation anneals must be limited to short duration periods (seconds) and typically require As overpressures (e.g., by placing a GaAs wafer in close proximity) to prevent crystal dissociation. When possible, lower temperatures are preferable so long as processing times remain reasonable. The wet oxidation of InAlP is typically done at 500° C., satisfying these thermal restraints. More importantly, the Er activation anneals do not require the very high temperatures found in many other Er host materials.

Figure 21:
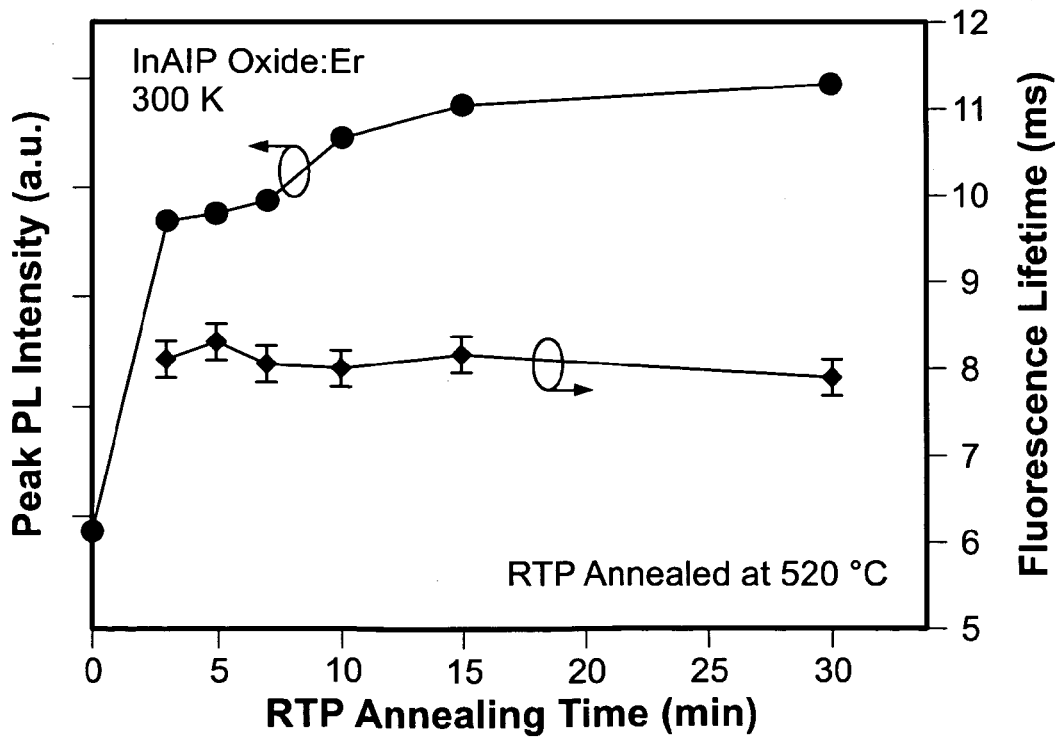
FIG. 21 is an example plot of peak photoluminescence intensity versus RTP annealing time and fluorescence lifetime versus RTP annealing time for post-oxidation Er-implanted samples.

FIG. 21 illustrates results of a study of the annealing time dependence of PL intensities and lifetimes at a low temperature of 520° C. in $N_2$ ambient gas for the post-oxidation Er-implanted samples using an RTP system. Unlike the short optimal annealing time of 3 seconds at the high temperature of 683° C. (see FIG. 18), the Er ions' activation rate is much slower when annealed at a lower temperature. After annealing for approximately 10 minutes, PL intensities approach saturation. No PL intensity drops were observed even after annealing for 30 minutes at 520° C., probably due to the negligible GaAs substrate dissociation at these temperatures.

Figure 22:
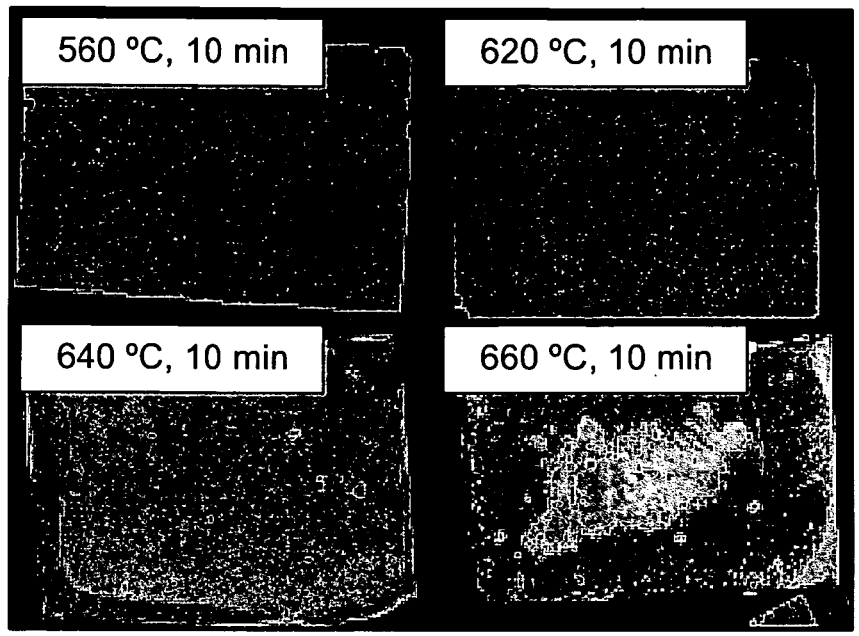
FIG. 22 illustrates example optical microscope images of InAlP samples.

This low temperature of 520° C. is also sufficiently below the possible glass transformation temperature in InAlP wet oxides suggested by the color change observed at approximately 620° C. after 10 minutes, as seen in FIG. 22. Thus, effective implant activation anneals can be performed even at a relatively low temperature (e.g., approximately 500° C.), confirming that the Er-doped InAlP oxide host is fully compatible with III-V semiconductor device processing thermal budget requirements.

Figure 23:
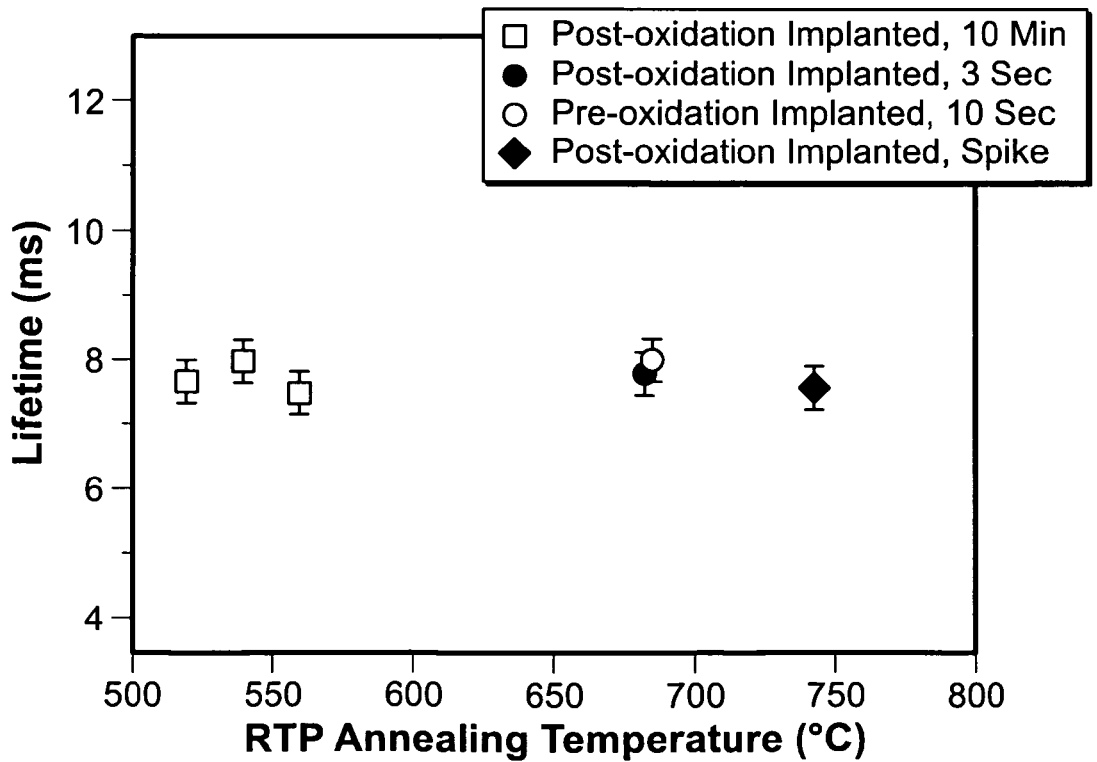
FIG. 23 is an example plot of lifetime versus RTP annealing temperature for both pre and post-oxidation Er-implanted InAlP native oxide samples.

Notably, as seen in FIG. 21, there is no significant fluorescence lifetime drop after these samples are annealed even for 30 minutes at 520° C. Furthermore, the PL lifetimes for both post and pre-oxidation-implanted samples remain near 8 ms after RTP annealing over the entire temperature range from 520 to 800° C. (FIG. 23), indicating minimal Er clustering and suggesting that even higher Er concentrations than employed in this initial study, very desirable for increased EDWA gain, are possible.

High Er-Solubility in AlGaAs and InAlP Oxides

Figure 24:
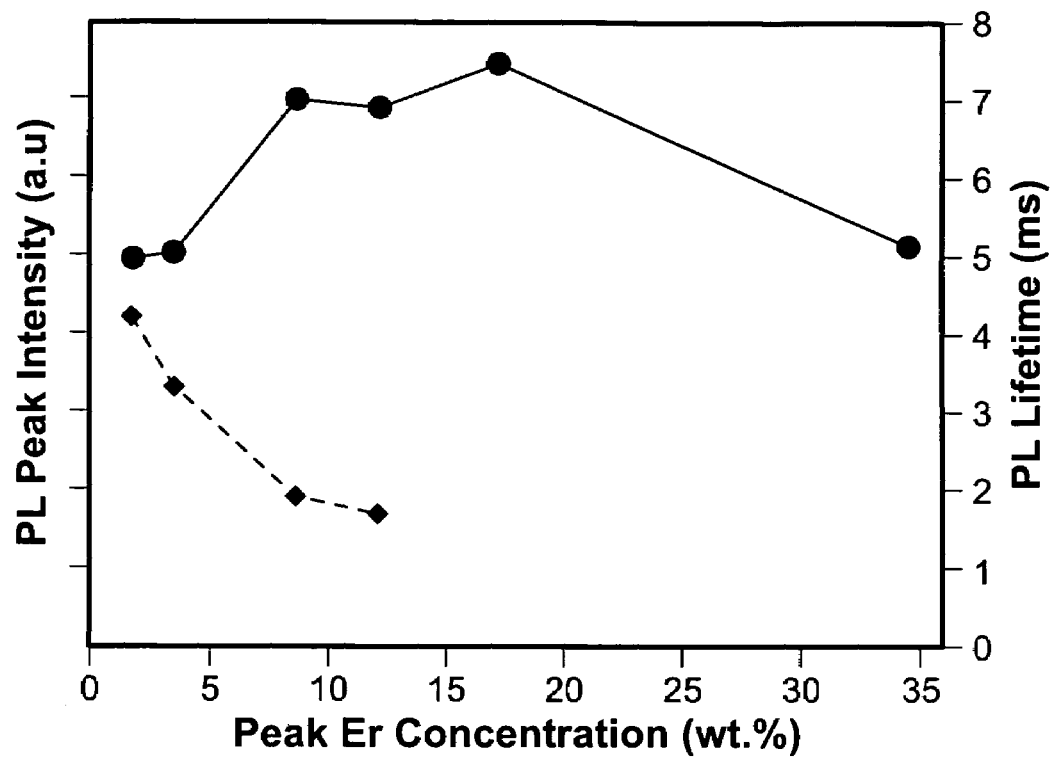
FIG. 24 is an example plot of photoluminescence peak intensity versus peak Er concentration and photoluminescence lifetime versus peak Er concentration for higher Er ion implantation doses.
Figure 25:
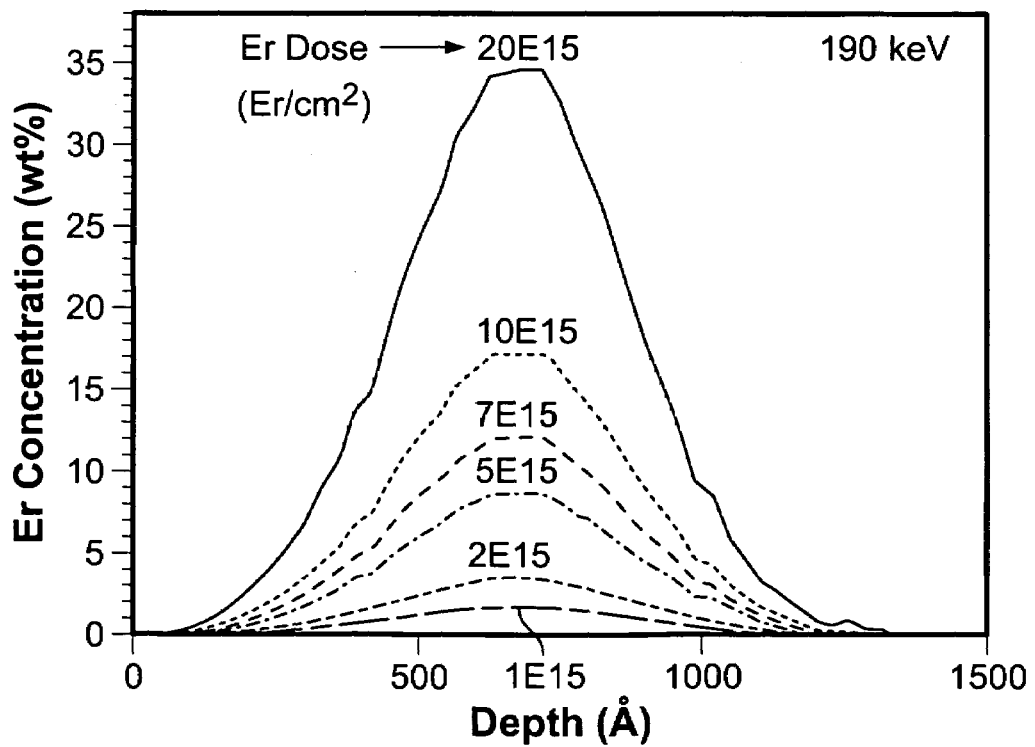
FIG. 25 is an example plot of Er concentration versus depth for various Er doses.

FIG. 24 shows the data obtained from subsequent experiments on the luminescence intensity and lifetime of InAlP native oxides doped with higher implant doses, yielding higher peak Er concentrations. The resulting doping profiles, as shown in FIG. 25, are simulated using TRIM'98 and the concentrations are converted to weight percentages by using the following formulas:

$$\rho_{Er}(g/cm^3) = \rho_{Er}(\#/cm^3) \frac{W_{Er}(g/mol)}{N_A(\#/mol)} \quad \text{Equation 4}$$

and $$wt\ \% = \frac{\rho_{Er}(g/cm^3)}{\rho_{Er}(g/cm^3) + \rho_{OX}(g/cm^3)} \times 100\% \quad \text{Equation 5}$$

In Equations 4 and 5, $W_{Er}$=167.3 g/mole is the atomic weight of Er, $N_A$=6.022×10$^{23}$ mol$^{-1}$ (Avogadro's number), and $\rho_{ox}$=3.13 g/cm$^3$ the oxide mass density.

The lowest concentration in this study, from a 190 keV Er implant with 10$^{15}$ cm$^{-2}$ dose, has an estimated peak Er concentration of $\rho_{Er}$=2×10$^{20}$ cm$^{-3}$ (or 1.73 wt. %) from TRIM'98 calculations, about 2× higher than that of our initial work. The PL intensity continues to increase for all implant doses up to 1×10$^{16}$ cm$^{-2}$, and single exponential decay with reasonable luminescence lifetimes $\tau \gtrsim 1.5$ ins is maintained even for estimated peak Er concentrations of up to 12 wt. % (implant dose of 7×10$^{15}$ cm$^{-2}$). This important result confirms the high Er solubility of the InAlP native oxides and its potential suitability as a viable host for Er-doped waveguide amplifiers or light sources. At the highest implant dose, a signal drop was observed, possibly due to much higher Er concentrations (~35 wt. % at peak) exceeding its solubility in InAlP oxides, or due to the co-operative upconversion between very close Er ions (the energy transfer between Er ions can be substantially increased when they are so close to each other such that their wave functions overlap, even if the Er ions are totally compatible with their host materials). Due to large fitting errors with shorter lifetimes (<1 ms), the lifetimes from the two most heavily doped samples are not presented here, but are believed to be based on several hundreds of µs, based on their slower decays compared the measurement system's response time of approximately 0.1 ms, as described above.

Figure 26:
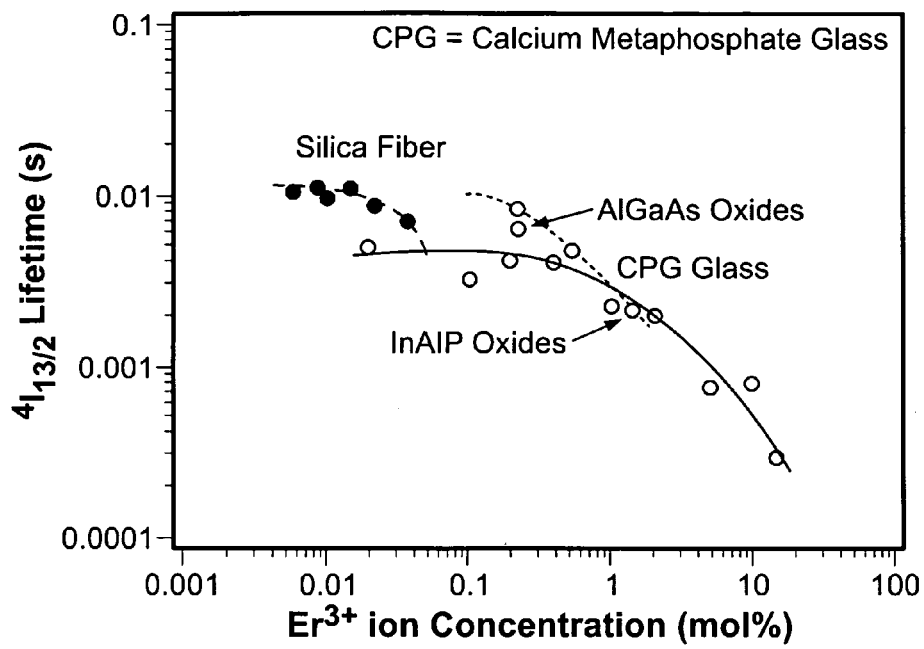
FIG. 26 is an example plot of fluorescence lifetime versus Er ion concentration in silica, calcium metaphosphate glass, AlGaAs and InAlP native oxides.

FIG. 26 shows a comparison of the Erbium excited state $^4I_{13/2}$ lifetime at different Er concentrations in InAlP and AlGaAs native oxides, silica and calcium metaphosphate glass (CPG). As can be seen, at a peak concentration level of approximately 0.23 mol % which corresponds to a concentration of the Er$^{3+}$ of 1.45×10$^{20}$ cm$^{-3}$ (see Table 1), the 8 ms lifetime from the Er-doped InAlP native oxide are approximately 2× longer than those reported for Er-doped CPG glass.

Monolithically-Pumped Erbium-Doped Waveguide Amplifiers/Lasers

Figure 27:
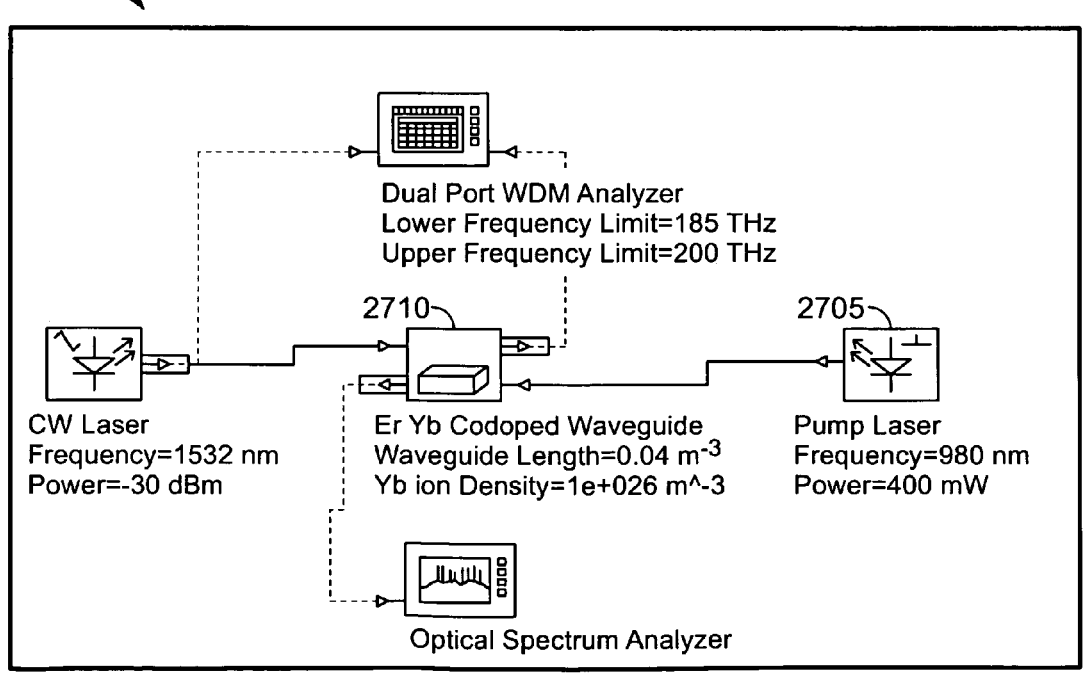
FIG. 27 is an example simulation layout for an EDWA.

Based on the optical properties obtained from Er-doped AlGaAs and InAlP native oxides described above, net optical gain from an example monolithically pumped EDWA has been simulated using commercial software OptiSystem4 from Optiwave, Inc., as shown in a simulation layout 2700 of FIG. 27. For simplicity, an example planar integration scheme with a backward end-coupling method is employed herein. The system configuration 2700 is similar to FIG. 4 above. However, instead of using an external pump source, an InGaAs 980 nm pump laser 2705 is monolithically coupled to an Er-doped waveguide region 2710 via an integrated WDM coupler. Table 4 lists various example simulation parameters, including optical transition cross sections and upconversion coefficients that reflect the AlGaAs native oxide is similar to Al$_2$O$_3$. In all simulations, the input signal power is −30 dBm at $\lambda$=1531 nm, where the gain is maximum, Other parameters are determined from the waveguide designs based on measured material properties. Such parameters include, but are not limited to waveguide dimensions, refractive indices, Er dopant concentration(s), and/or fluorescence lifetimes. The example waveguide background loss is set to 0.5 dB/cm, which could be reasonably achievable for the oxidized AlGaAs heterostructure waveguides as discussed in further detail below.

TABLE 4

| Parameters | Values |
| --- | --- |
| Emission and absorption cross sections | $\sigma_{Er21}(\lambda = 1531\ nm) = 6.0 \times 10^{-21}\ [cm^2]$ |
| | $\sigma_{Er12}(\lambda = 1531\ nm) = 6.0 \times 10^{-21}\ [cm^2]$ |
| | $\sigma_{Er13}(\lambda = 980\ nm) = 2.5 \times 10^{-21}\ [cm^2]$ |
| Upconversion coefficients | $C_{up} = 4.1 \times 10^{-18}\ [cm^3 s^{-1}]$ |
| Nonradiative relaxation rate | $A_{32} = 1.0 \times 10^9\ [s^{-1}]$ |
| Er induced excess loss | For [Er] = $10^{19} \rightarrow 2 \times 10^{20}\ [cm^{-3}]$ |
| | $l_{sEr} = 0.12{\sim}0.29\ [dB/cm]$ |
| | $l_{sEr} = 0.15{\sim}0.37\ [dB/cm]$ |

Figure 28:
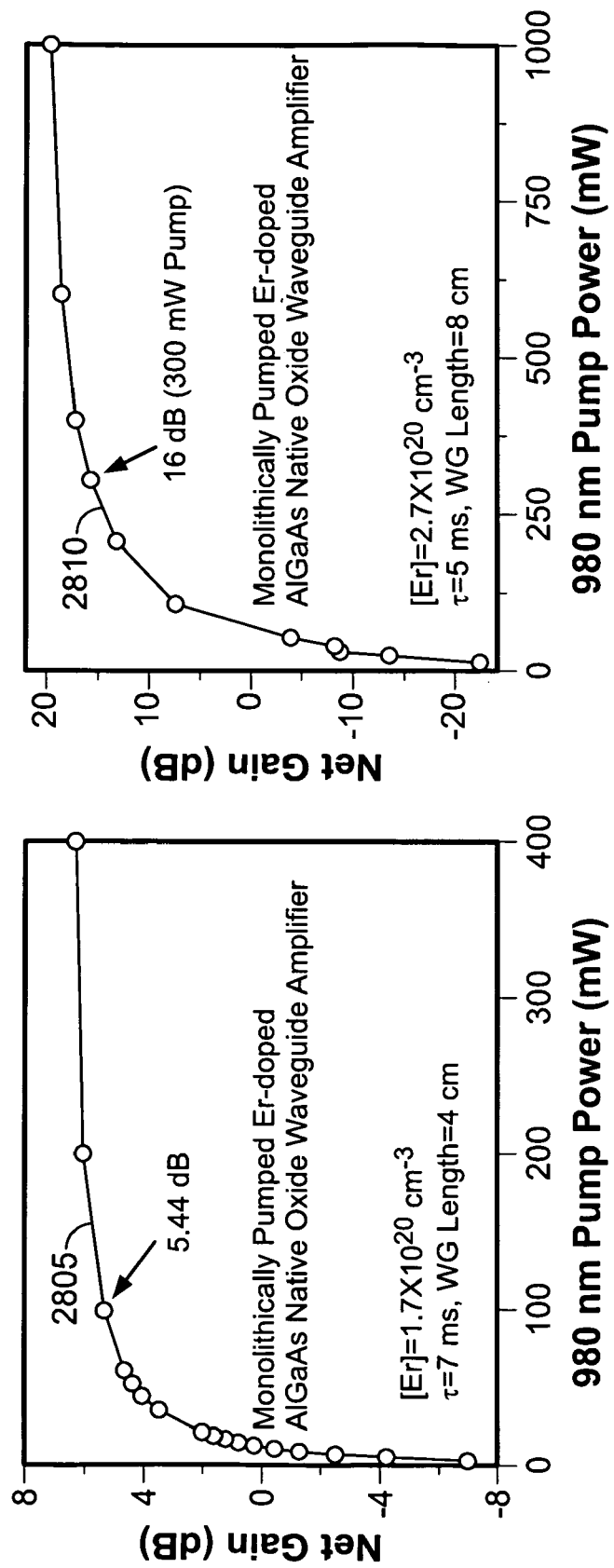
FIG. 28 illustrates example plots of net gain versus pump power for monolithically pumped waveguide amplifiers doped with Erbium.

FIG. 28 illustrates gain versus pump power for a first example waveguide having an Er concentration of 1.7×10$^{20}$ cm$^{-3}$ (see curve 2805), and a second example waveguide having an Er concentration of 2.7×10$^{20}$ cm$^{-3}$ (see curve 2810). In particular, FIG. 28 illustrates that an example 4 cm-long AlGaAs native oxide waveguide doped with 1.7× 10$^{20}$ cm$^3$ Er (curve 2805) corresponds to a 5.44 dB net optical gain when the first example waveguide is monolithically pumped at 100 mW (with a saturation gain of about 6 dB). Increasing the Er concentration to approximately 60% and using an estimated reduced lifetime of T=5.0 ms, the simulation for the second curve 2810 projects a 16 dB net gain (for an example 8 cm long waveguide amplifier), which is similar to commercial EDFAs. Due to the higher Er solubility possible for InAlP native oxides and comparable longer fluorescence lifetimes, even higher gains may be achievable from a monolithically-pumped waveguide amplifier with an Er-doped InAlP native oxide core layer.

Group III-V Native Oxide Waveguides

Oxidized AlGaAs semiconductor waveguide heterostructures with large refractive index variations realized by wet thermally oxidized Al$_x$Ga$_{1-x}$As having an Al composition (x)

($n \leq 1.5$ for x=0.9 to n>1.7 for x=0.3 at 633 nm) may also support optical waveguiding. Propagation losses of less than $\alpha=1.0$ cm$^{-1}$ (4.3 dB/cm) for a broad spectral range between $\lambda_0=0.63$ and 1.55 μm were achieved for an example fully oxidized $Al_{0.3}Ga_{0.7}As$—$Al_{0.85}Ga_{0.15}As$ planar one-dimensional waveguide. Such measured waveguide losses may be reduced further (to $\leq 0.5$ dB/cm) to enable two-dimensional waveguides (required for EDWA applications).

Based upon observations by secondary ion mass spectrometry (SIMS) of non-uniform distributions of As and H in surface oxidized AlGaAs samples, an interdiffusion of heterostructures is suggested which may lead to a rough interface in an oxidized heterostructure and make it difficult to reduce the propagation loss further (e.g., less than approximately 1 dB/cm). This may present a potential obstacle for achieving a higher net optical gain for both EDWA and Er-doped waveguide light source applications. However, to minimize the possible inter and out-diffusion of reactants and byproducts across the heterostructure interface during the wet oxidation processes, a lateral oxidation method may reduce the propagation loss further.

Figure 29B:
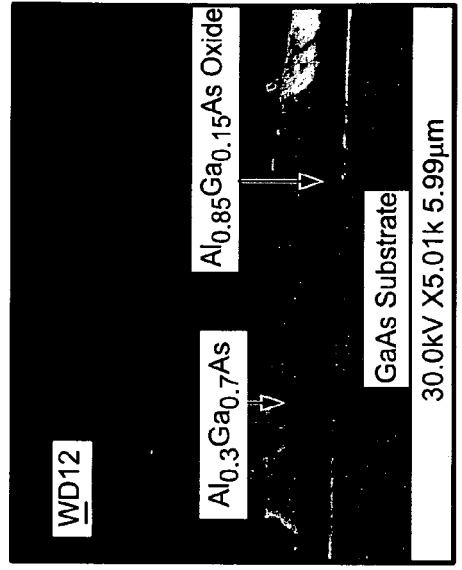
FIGS. 29A-D illustrate delamination effects for example oxidized heterostructure layers.
Figure 29D:
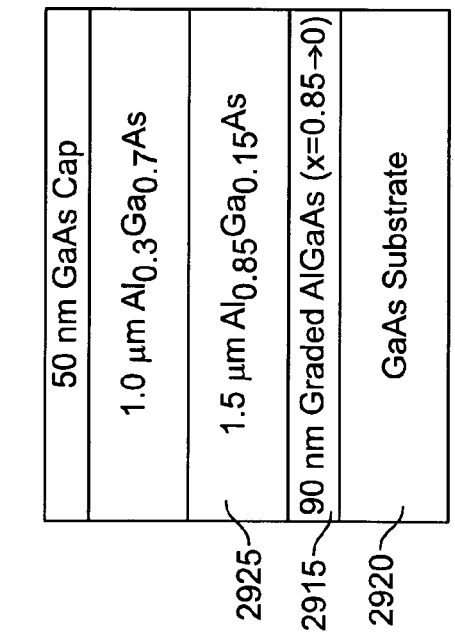
Figure 29A:
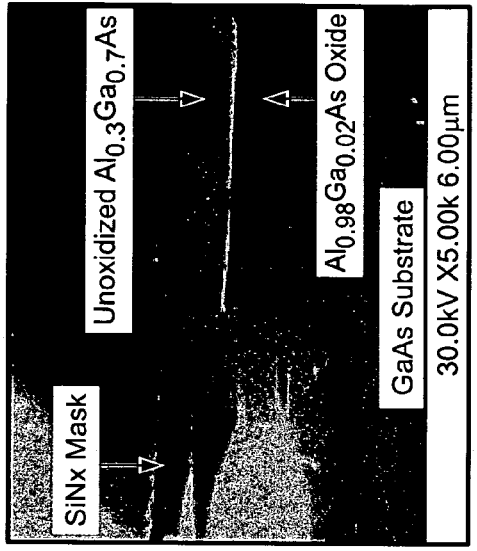
Figure 29C:
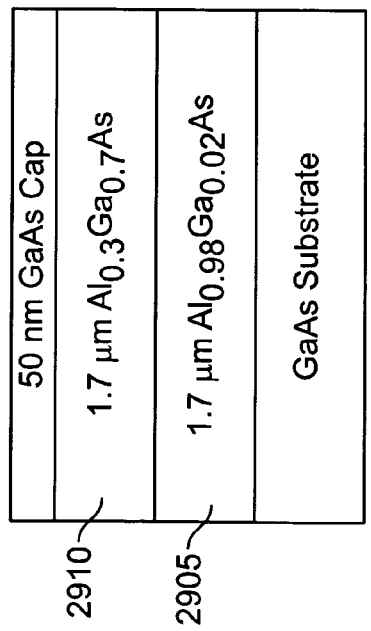

The initial example structure designed for reducing loss oxide waveguides through a combination of lateral and surface oxidation methods is shown in FIG. 29A. The example high Al content $Al_{0.98}Ga_{0.02}As$ lower cladding layer 2905 is designed to oxidize rapidly laterally from etch-exposed sidewalls, thereby allowing $Al_{0.3}Ga_{0.7}As$ core layers 2910 to be surface oxidized such that the interface between these layers sees minimal cross-diffusion of oxidants and reaction byproducts. However, due to the large volume shrinkage after the lateral oxidation process, this initial wafer design shows a serious delamination problem, as shown in FIG. 29B. On the other hand, FIG. 29C illustrates elimination of this problem with an example second wafer 2915 having a 90 nm compositionally graded region between a substrate 2920 and top heterostructure layers. Besides the lower Al composition and the reduced thickness for bottom cladding layers 2925 in this example structure (as compared to the wafer structure of FIGS. 29A and 29B), a very slow cooling rate (e.g., approximately 1-2° C./min) occurs after wet oxidation in FIGS. 29C and 29D, which is important for controlling delamination problems. As shown in FIG. 29D, there are no apparent delamination issues observed after this example structure is laterally oxidized in $N_2/H_2O$.

Accordingly, FIGS. 29C and 29D illustrate that the example 1.5 μm oxide 2925 is the thickest AlGaAs layer laterally oxidized on a GaAs substrate without delamination problems. Notably, the example delamination control method described herein has apparent benefits not only for the oxide waveguide fabrication, but also for other possible applications where a thick buried oxide layer is beneficial, such as for GaAs on Insulator (GOI) for electronic devices or high index contrast optical waveguides.

For the example passive oxide waveguide fabricated herein, the non-perfect sidewalls contribute significantly to the waveguide propagation loss through light scattering from rough vertical interfaces arising mainly from the photolithography process. Therefore, special care in the fabrication process may be taken in order to minimize such sidewall roughness. Specific steps shown to be effective include, but are not limited to:

(a) Using a projection printing system (wafer stepper) for photolithography to minimize the interference fringes on the photo resist as observed in a conventional contact lithography process.

(b) Preparing the etching solutions in an isothermal water bath at room temperature, and stirring the solutions for a relatively long time (e.g., greater than approximately 30 min), thereby insuring a proper homogenization of different chemical species and removing some of the oxygen radicals, which could be formed on the surface from the mixing of the etchant solutions.

(c) Avoiding agitation of the substrate or the solutions during the actual etching process to enhance the diffusion-limited etch process. This may have a polishing effect which produces smoother sidewalls. The example etching solution used herein includes, but is not limited to, $H_2SO_4:H_2O_2:H_2O$ (1:1:100) with a slow etching rate of approximately 13.5 Å/sec.

Figure 30:
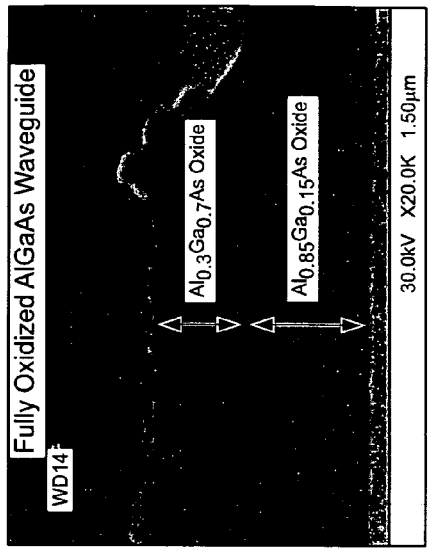
FIG. 30 illustrates an example mode profile and an example SEM image cross section of an AlGaAs heterostructure RWG.
Figure 30:
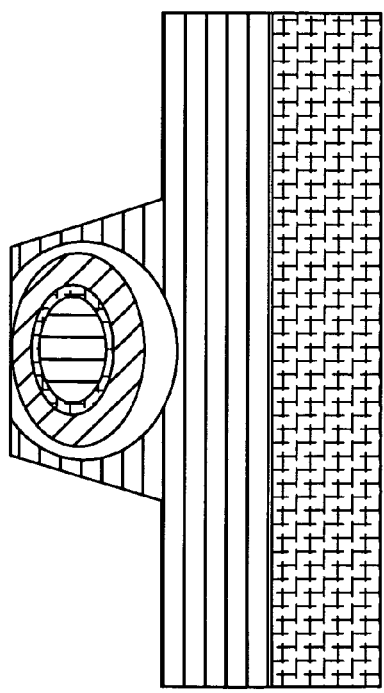

The example techniques described herein allow fabrication of a two-dimensional 3.5 μm ridge waveguide having a 1 μm surface oxidized $Al_{0.3}Ga_{0.7}As$ core layer (n=1.66) and a 1.5 μm laterally oxidized $Al_{0.85}Ga_{0.15}As$ bottom cladding layer (n=1.50). FIG. 30 illustrates an example simulation using OptiWave's OptiBPM program to demonstrate good optical confinement with a single mode waveguide at 1.55 μm. With this example structure and example fabrication process, it is possible to achieve waveguides of sufficiently low loss to allow realization of net amplifier gain in Er-doped structures.

Figure 31:
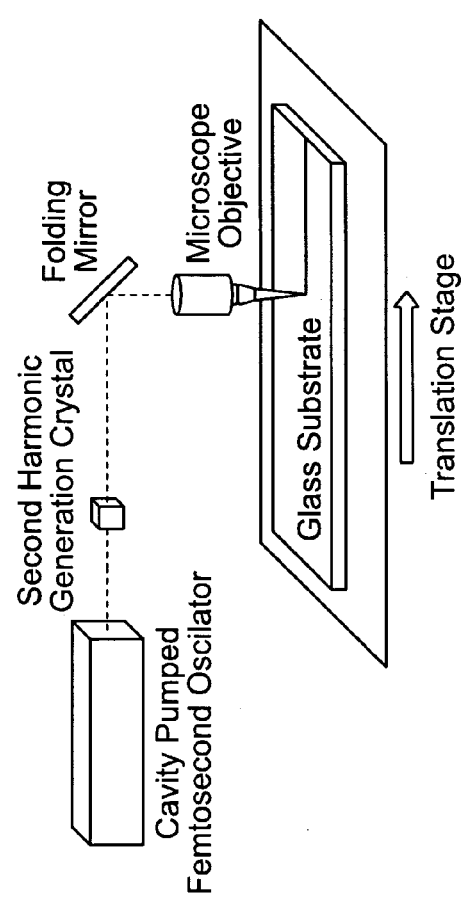
FIG. 31 illustrates an example schematic of a transverse geometry waveguide writing setup.

Spectroscopic ellipsometry measurements show that the example wet thermal native oxides of $In_{0.5}Al_{0.5}P$ formed at 500° C. have a refractive index of n=1.577 at 1.55 μm. This is sufficiently larger than that of native oxides of $Al_xGa_{1-x}As$ having Al compositions of $x \geq 0.8$ ($n \leq 1.50$ at 1.55 μm), thereby illustrating that waveguiding is achievable in oxidized InAlP/AlGaAs heterostructures, Waveguide Shaping and Writing FIG. 31 illustrates an example simplified schematic of a typical fabrication setup 3100 for fabrication of optical waveguides. The example setup 3100 may employ, without limitation, femtosecond lasers for fabrication of optical waveguides, such as passive oxide waveguides. Localized refractive index changes may be induced inside bulk glasses at focal point of a focused near infrared laser beam, as shown in the simplified example schematic 3100 of FIG. 31. Such transverse writing geometry is flexible and allows the fabrication of waveguides having arbitrary length.

Additionally, such laser-written devices may be realized in a number of glass systems, including fluoride, fused silica, germanosilicate, chalcogenide, borosilicate and phosphate glasses. High quality waveguides with a propagation loss below approximately 1 dB/cm at 1550 nm may be produced in fused silica glass. Laser action also may allow for a 2-cm-long waveguide to be fabricated on an Er:Yb-doped phosphate glass substrate by femtosecond laser pulse writing, with an output of 1.7 mW at 1533.5 nm achieved at approximately ~300 mW pump power coupled into the example waveguide.

Semiconductor/Oxide Hybrid Structure Waveguides

To achieve very compact integration, such as a long spiral of waveguide occupying a small area, a large core/cladding index contrast is needed to increase the optical confinement and reduce the bending loss. Novel semiconductor/oxide hybrid waveguide structures have been designed to combine the high refractive indices of semiconductors with a suitably positioned Er-doped oxide active layer.

Figure 32:
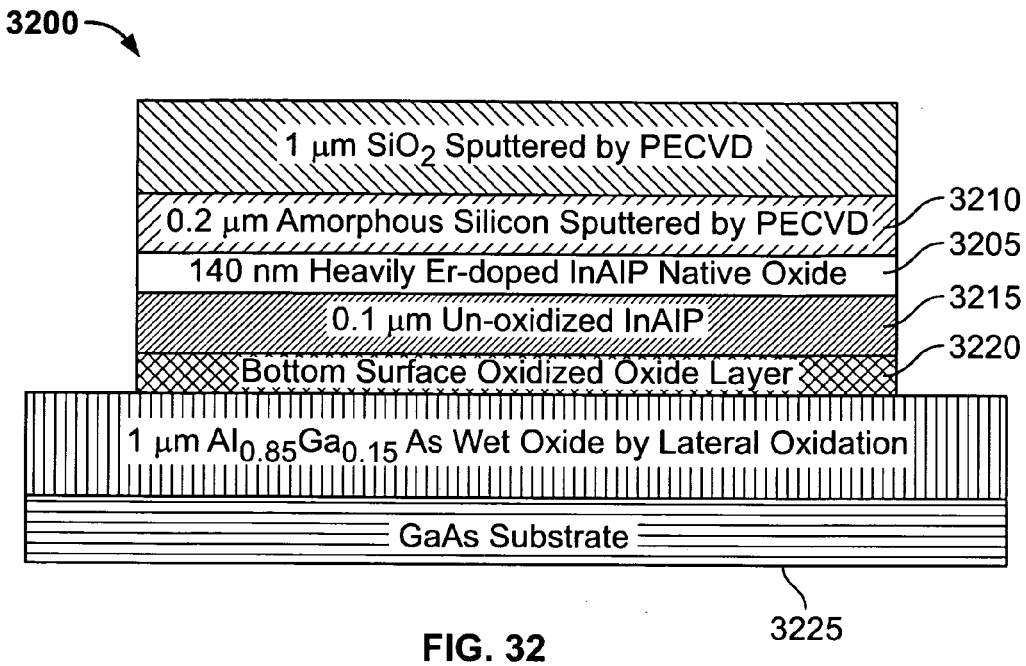
FIG. 32 illustrates an example schematic structure of a low loss Er-doped waveguide using Er-doped InAlP native oxide.

FIG. 32 illustrates an example sandwiched structure 3200 to achieve compact and strong optical confinement in an oxide waveguide. In the example structure 3200, an active Er-doped oxide layer 3205 is sandwiched between an upper high refractive index semiconductor layer 3210, and a bottom high refractive index semiconductor layer 3215. The example bottom high refractive index layer 3215 is the un-oxidized semiconductor remaining after a simultaneous lateral and surface oxidation. After Er-implantation to a surface oxide layer 3220, the upper high index layer 3210 may include, but is not limited to, a sputtered amorphous silicon layer or other high refractive index layers formed by sputtering, or another deposition method. These two example layers are transparent at both signal ($\lambda$=1.55 µm) and pump ($\lambda$=1.48 µm) wavelengths (possibly through a GaInNAs—GaNAs quantum well laser that is monolithically integrated on a GaAs substrate 3225). A strong optical confinement may be achieved in such example compact structures as a result of the large refractive index contrast between the semiconductor and oxide layers. Additionally, the higher lateral index contrast of ridge waveguide structures may enable a smaller bend radius of curved waveguides, which is particularly beneficial for enabling lower loss and longer waveguides in monolithic integrated EDWA applications. Moreover, the smooth interface between semiconductors and oxides may also help to further reduce the propagation loss.

Figure 33:
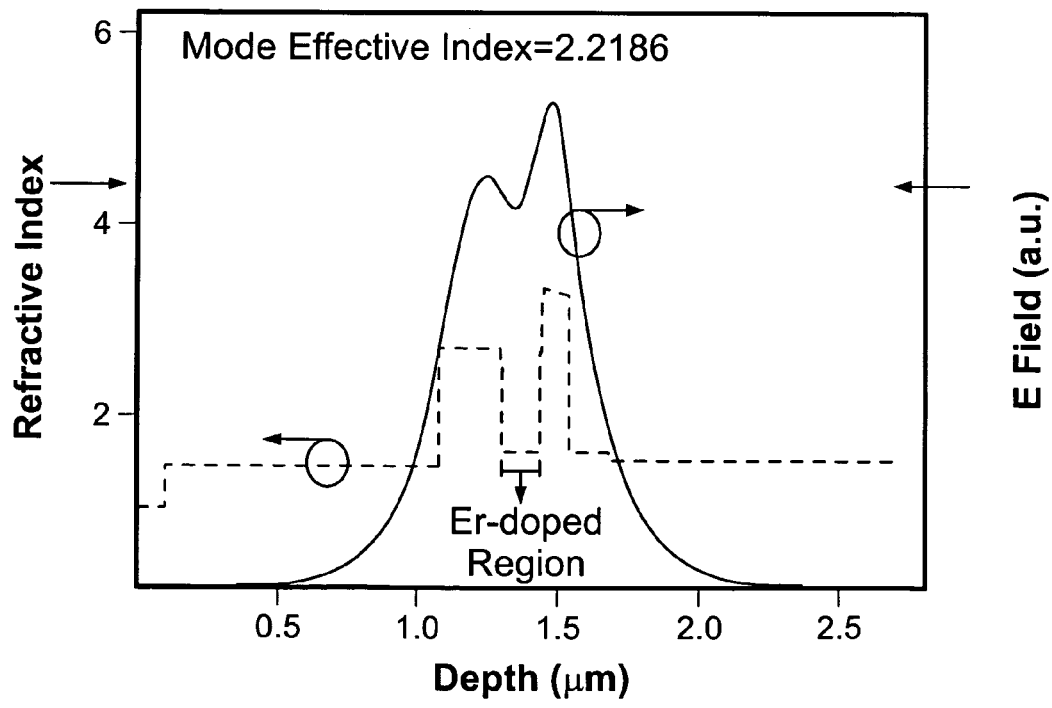
FIG. 33 illustrates an example plot of refractive index versus depth and E field versus depth for the example waveguide structure of FIG. 32.
Figure 34:
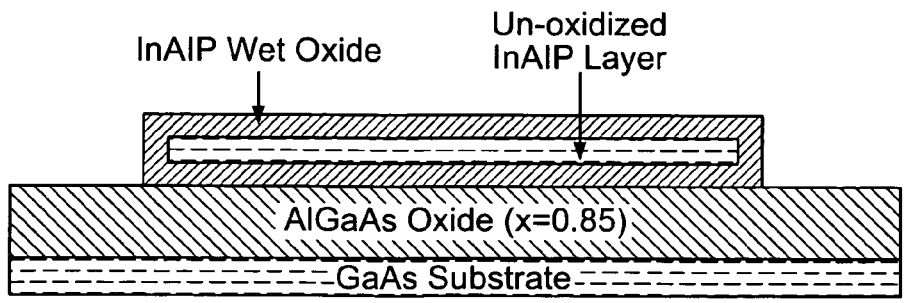
FIG. 34 illustrates an example process flow for fabrication of example Er-doped group III-V native oxide waveguides having a high-index-contrast sandwich structure.
Figure 34:
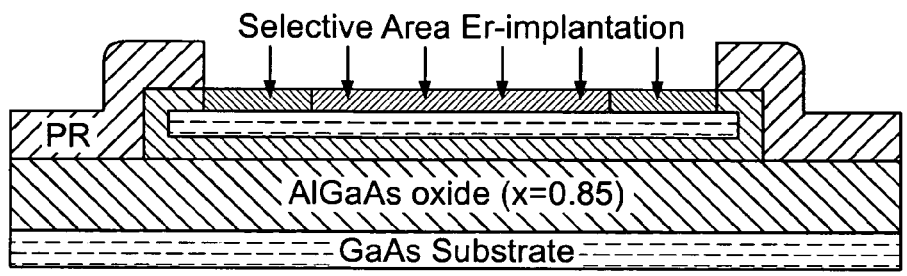
Figure 34:
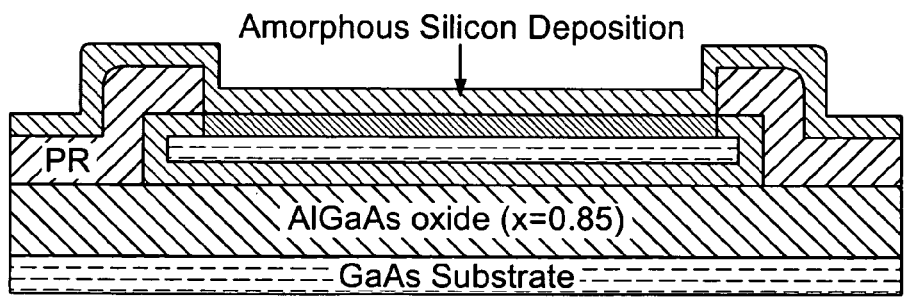
Figure 34:
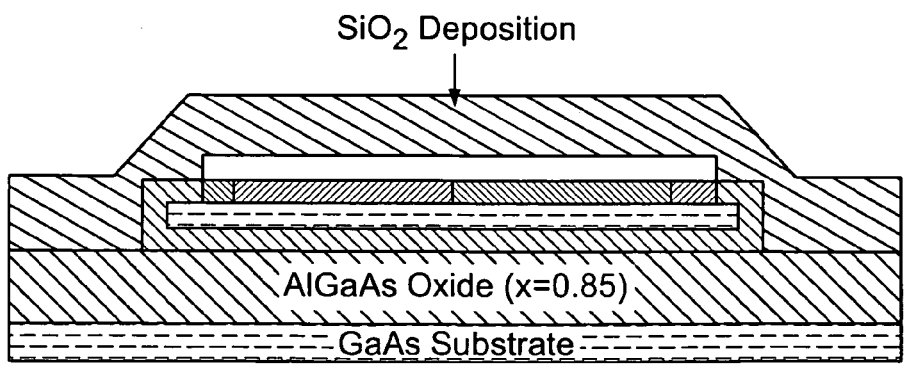

For the example waveguide structure 3200 of FIG. 32, an example optical field of the fundamental guiding mode is shown in FIG. 33 as simulated using CAMFR (CAvity Modeling Framework, which is a fast, flexible, and full-vectorial Maxwell solver). FIG. 33 illustrates an example coupled-waveguide-like distribution where the Er-active region is at a very high optical field, thereby allowing effective pumping of, and signal absorption by, Er-ions for stimulated emission. Example process flows are illustrated in FIG. 34 to fabricate the example sandwich structure 3200 as shown in FIG. 32.

Figure 35:
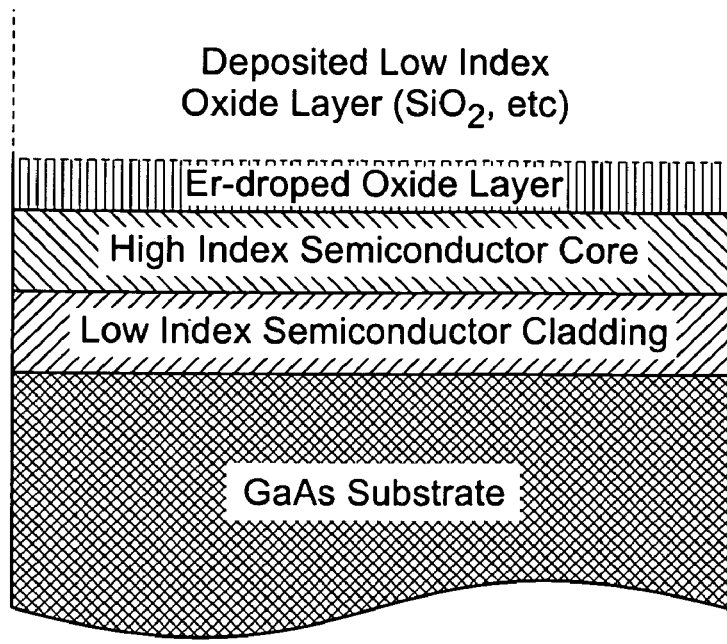
FIG. 35 illustrates an example schematic of a semiconductor/oxide hybrid waveguide.

In another example structure shown in FIG. 35, the bottom cladding layer is a semiconductor layer with a lower refractive index, and the active Er-doped oxide layer is grown and implanted on top of a high refractive index semiconductor core layer. These two layers of oxide/semiconductor can be viewed here as forming a composite waveguide core, where the active Er ions are placed along the top edge instead of near the center of the core as in conventional designs. With the novel vertical intra-cavity pump (VIP) schemes described herein, it might actually not be optimal to put the Er active layer in the center of the waveguide core, where there is maximum light intensity. Due to the vertical pump nature in the VIP scheme, a high optical pump power can be maintained for the $Er^{3+}$ ions even if the Er-active region is in an evanescent portion of the waveguide mode field, because the pump light is oscillating in the vertical direction instead of traveling along the waveguide core. With most of the Er emission then guided through an underlying transparent semiconductor core through what is essentially a waveguide coupling mechanism (the emission from $Er^{3+}$ ions can be stimulated via evanescence field and still be guided within the semiconductor core), this offset of the $Er_{active}$ layer may also serve to reduce the undesirable excited state absorption (ESA). ESA occurs where an excited $Er^{3+}$ ion absorbs a photon emitted at 1.53 µm from other $Er^{3+}$ ions, boosting itself to a higher $^4I_{9/2}$ energy level. To reduce scattering loss from the higher index contrast oxide/air interface, an optional top oxide cladding ($SiO_2$, $Al_2O_3$, $SiN_x$, etc) can be deposited after Er-implantation.

Figure 42A:
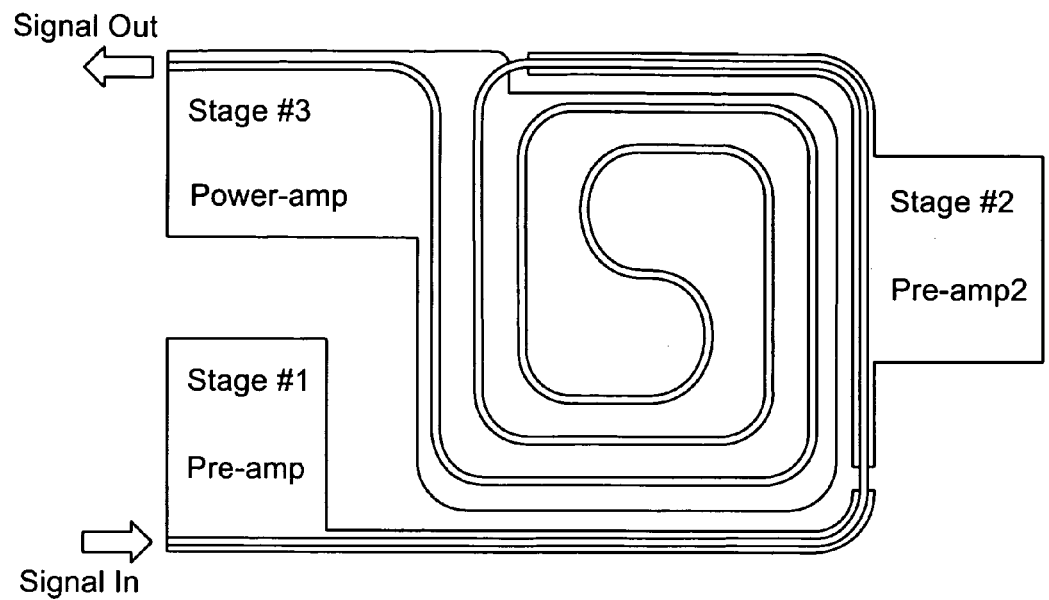
FIGS. 42A and 42B illustrate example pumping mechanisms.
Figure 42B:
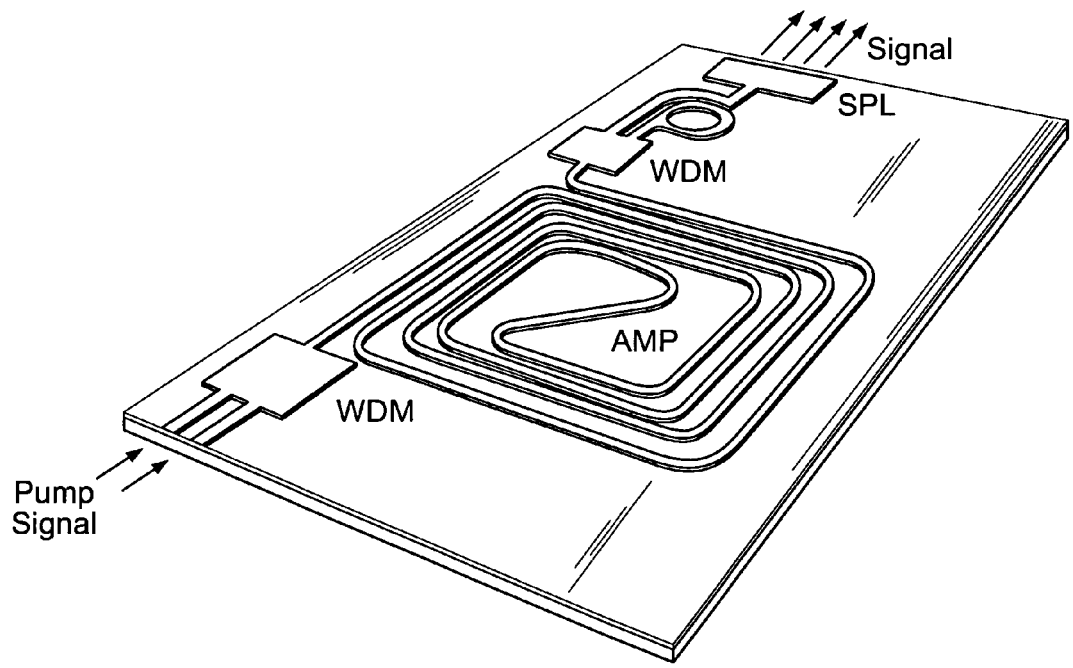

Due to the large refractive index contrast between the semiconductor and oxide layers, very strong optical confinement can be achieved in very compact structures employing thinner waveguiding layers. In addition, the higher lateral index contrast of ridge waveguide structures enables smaller bend radius curved waveguides desirable for fabricating long spiral-coiled waveguides in monolithically integrated EDWA applications, as shown in FIG. 42B below. Moreover, the epitaxially smooth interface possible between semiconductor layers may also help to further reduce the propagation loss compared to a fully-oxidized heterostructure waveguide.

Figure 36:
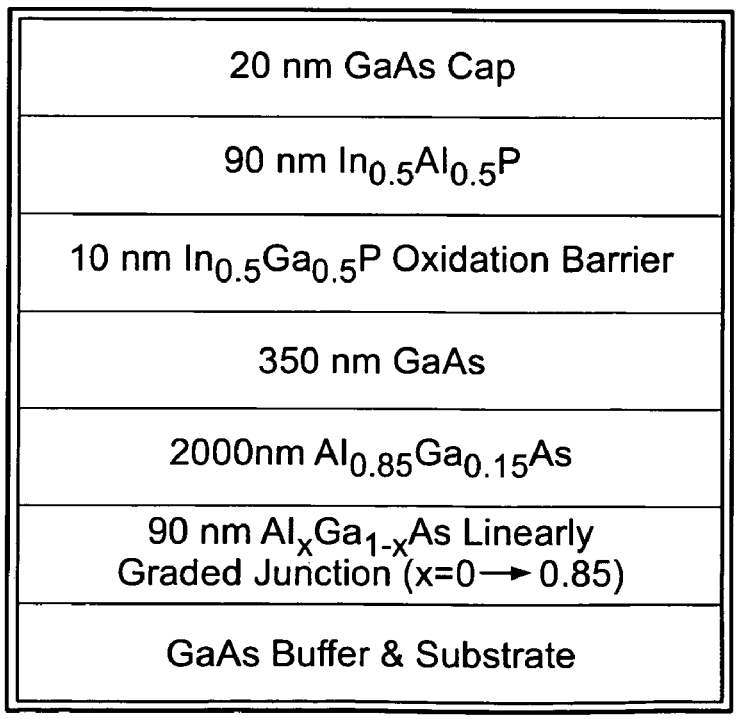
FIG. 36 illustrates an example wafer design for single layer oxide/semiconductor hybrid structure waveguides.

Utilizing the high refractive index of AlGaAs and the large refractive index difference between AlGaAs of different Al compositions, a detailed hybrid oxide/semiconductor waveguide wafer design is shown in FIG. 36. All of the semiconductor layers of GaAs, $Al_{0.85}Ga_{0.15}P$ and the InGaP oxidation barrier layer are transparent at both the signal wavelength of approximately 1.53 µm and the pump wavelength of 0.98 µm. After wet oxidation, the InAlP epilayer will expand to a ~150 nm thick oxide.

Figure 37:
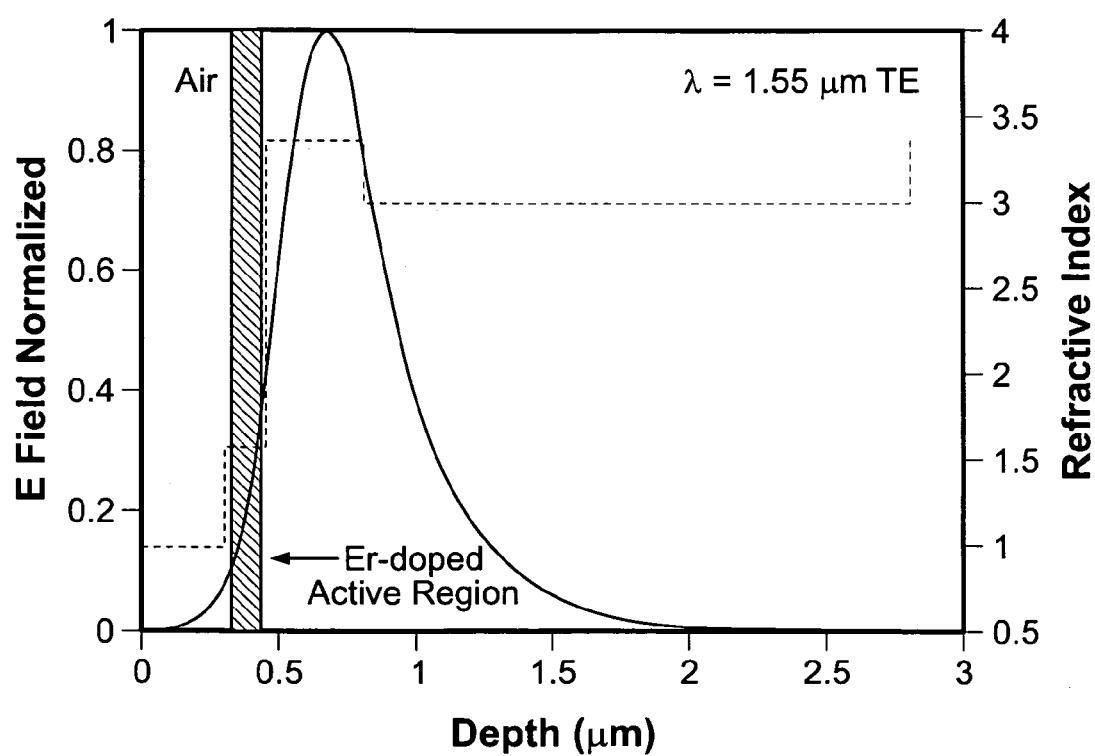
FIG. 37 is an example plot of normalized E field versus depth and refractive index versus depth for the example wafer design of FIG. 36.

Due to limitations of OptiBPM to simulate such a structure, other software has been used to calculate the waveguide mode profiles of the structure in FIG. 36. As seen in FIG. 37, the tightly-confined mode profile is calculated using CAMFR (CAvity Modeling Framework), an open source full-vectorial Maxwell solver.

As with semiconductor heterostructures, such composite semiconductor/oxide hybrid structures provide tremendous design flexibility through the variation of many parameters such as Al composition, and the order, number and thickness of layers. More advanced designs of this type will require simultaneous consideration of and optimization of waveguide optical mode confinement, the multilayer vertical reflectance properties and their influence on the VIP cavity, etc.

Figure 38A:
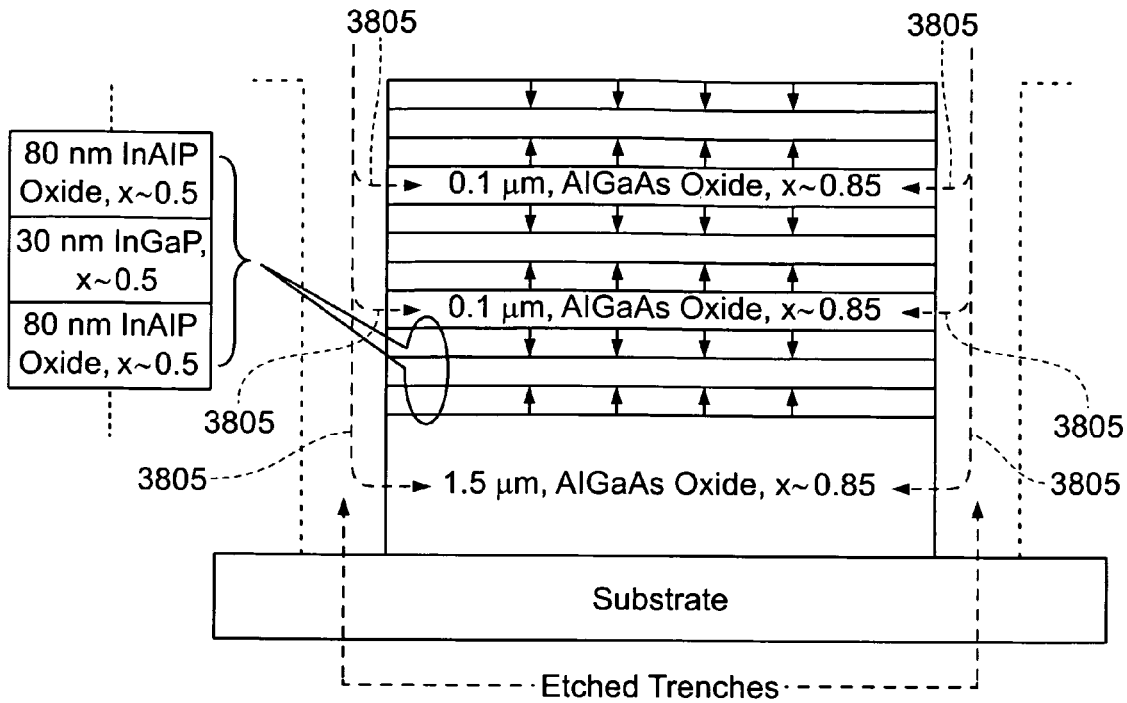
FIG. 38A illustrates an example composite lateral AlGaAs oxide growth/vertical INAlP oxide growth/un-oxidized InGaP composite core waveguide structure.
Figure 38B:
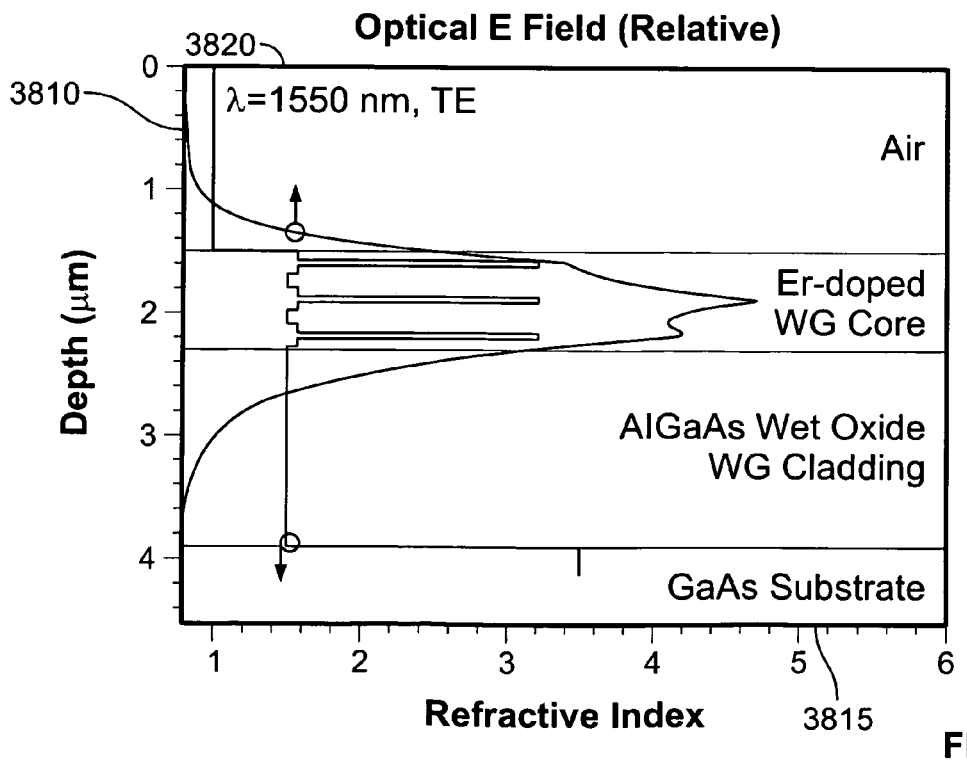
FIG. 38B illustrates an example plot of depth versus refractive index for the example waveguide structure of FIG. 38A.

Yet another example waveguiding structure is shown in FIG. 38A. FIG. 38A illustrates an example composite lateral AlGaAs oxide growth/vertical InAlP oxide growth/unoxidized InGaP composite core waveguide structure for achieving core effective index values greater than approximately 1.7 for high contrast waveguiding. Various arrows 3805 of FIG. 38A illustrate oxidation growth directions. FIG. 38B illustrates an example plot of depth (µm) 3810 versus refractive index 3815 and depth 3810 versus a relative optical E field 3820 for the example waveguide of FIG. 38A. By using the example multilayer structure of FIG. 38A containing high-index oxidation-resistant semiconductor layers (such as InGaP which has been used in MOSFET structures as oxidation barrier layers), a composite core layer with higher average effective index can be realized. Using the open source program CAMFR, an example simulation of a preliminary design of such a waveguide has been performed to yield an effective modal index in the composite core of $n_{eff}$=1.715 and a relatively high index contrast greater than 0.21 for the example vertical waveguiding structure. This simulation compares quite favorably to the 0.20 index contrast of the sputtered $Al_2O_3/SiO_2$ waveguide shown in FIG. 5 above. With this relatively high contrast, an example EDWA of 4 cm total waveguide length spiral coiled into a ~1 mm×1 mm area includes a net gain of 2.3 dB when end-pumped with a power of just 9 mW at 1.48 µm. Arising from the large refractive index contrast between the example core and cladding layers, very strong optical confinement can be achieved in compact structures with thinner layers and smaller bend radii, both of which are desirable for lower loss and longer waveguides for EDWA applications.

In the example structure of FIG. 38A, most of the core layer is formed by oxidized InAlP (shown above to be the best Er host) which, because of its diffusion limited (sublinear) growth kinetics, will grow more slowly outward from the porous "oxidant channels" formed by thinner laterally oxidized $Al_{0.5}Ga_{0.15}As$ layers. As shown above in FIG. 29D, the lateral oxidation of $Al_{0.85}Ga_{0.15}As$ is feasible for mesa widths utilized in these example ridge waveguide devices. The smooth interfaces of an epitaxially-grown superlattice-type heterostructure and the small dimensions of the layers relative to the optical wavelength may combine to provide minimal scattering losses. Such example composite waveguide structures provide tremendous design flexibility.

Moreover, the example higher index contrast structure of FIG. 38A allows a thinner (e.g., approximately 1.5 µm) AlGaAs oxide lower cladding layer (such as that shown in FIG. 29D), and a thinner core layer that is more compatible with doping via high-energy Er-implantation. Uniform doping over the core region is typically achieved by multiple implants of different energies.

Vertical optical confinement in a bulk InAlP layer may be provided by the Er implantation profile if the refractive index in the doped regions is sufficiently larger than in the undoped regions. In particular, because Er is a very heavy element and high concentrations are possible in this phosphate-based host, there may be an appreciable index change. If so, a Gaussian shape of the implantation profile may effectively form a graded-index waveguide. Such Er-doping-induced index step may also be applied for lateral waveguide definition through selective area Er implants. Measuring the refractive index change induced in InAlP oxide layers upon heavy doping with Er may be accomplished with a variable angle spectroscopic ellipsometry system.

Integration Schemes

Building on a GaAs platform, various example schemes are envisioned to monolithically integrate pump or signal lasers with Er-doped planar waveguides. In one example approach described in view of FIG. 5, an end-coupling method is shown. However, other possible approaches are described below.

Figure 39A:
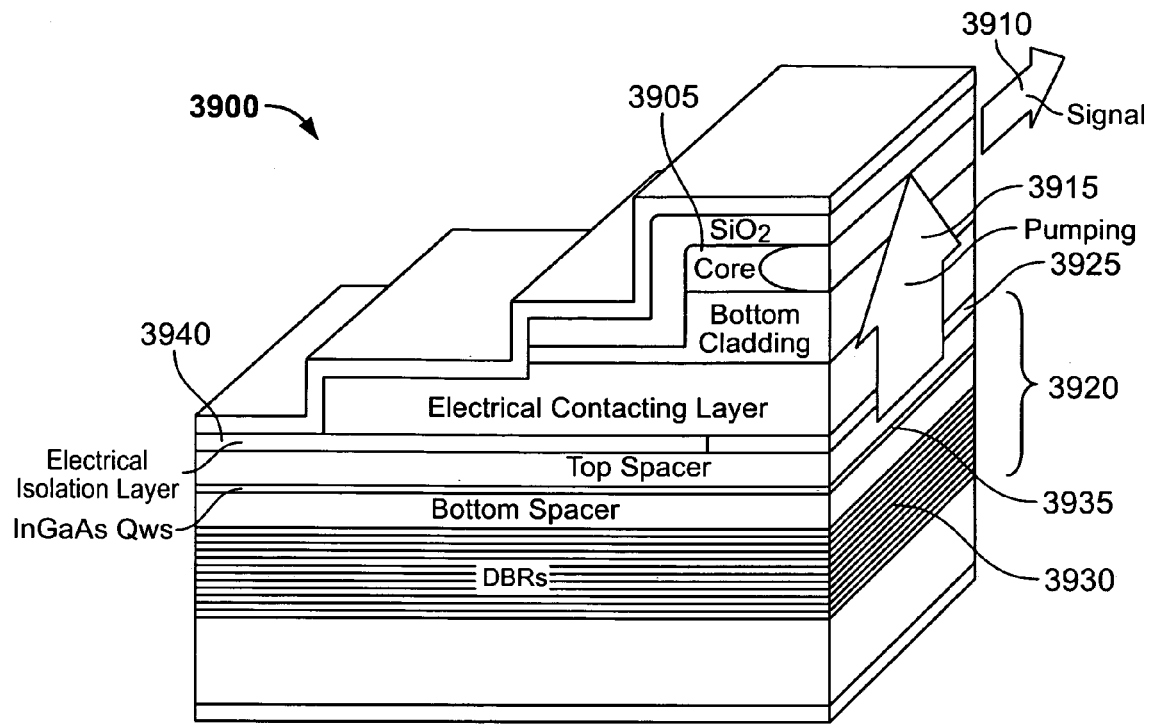
FIG. 39A illustrates an example schematic of an example vertical intra-cavity pump method for monolithic optoelectronics integration.

Due to the high Er concentration required to reach a high gain per unit length, cooperative up-conversion interactions between the closely spaced Er ions may reduce the pumping efficiency, thereby requiring a rather high pump power to obtain a net gain. However, this example limitation is addressed by an example vertical intra-cavity pumping (VIP) method. FIG. 39 illustrates an example schematic 3900 of the VIP method. In the illustrated example of FIG. 39, a fully-oxidized III-V heterostructure waveguide 3905 is designed for amplification and/or laser signal ($\lambda$=1.55 µm) propagation 3910 in a horizontal direction. A pump light 3915 ($\lambda$=980 nm) oscillates inside a vertical cavity 3920 formed between a top metal mirror 3925 and bottom Distributed Bragg Reflector (DBR) mirrors 3930, with the pump light InGaAs quantum well gain media 3935 placed therein. This concept is particularly applicable to a vertical-cavity surface emitting laser (VCSEL) with a monolithically integrated horizontal waveguide.

Compared to the conventional pumping methods, the example VIP method has several key advantages including, but not limited to, high pumping efficiency, distributed pumping, noise control, and/or simplicity.

In view of the high pumping efficiency advantages, pump power is largely confined inside the short vertical cavity 3920, resulting in negligible coupling loss between the pump and Er-doped active region 3935. With multiple reflections between the top and bottom mirrors (3925, 3930), the very high optical fields that may be achieved inside this vertical cavity 3920 may also compensate for the low pump absorption cross section of Er ions, yielding significantly higher pump efficiencies than possible with a conventional end pumping method (where the pump light passes through the waveguide just once or twice). This enables a reduction of the pump source power requirements, which may otherwise be a significant determinant in present system costs. In a similar example scheme, significant PL enhancements were observed when an Er-active region was placed inside a SiO$_2$/Si micro-cavity (by a factor of $G_a$=4F/$\pi$, where F is the finesse of the cavity).

Figure 40:
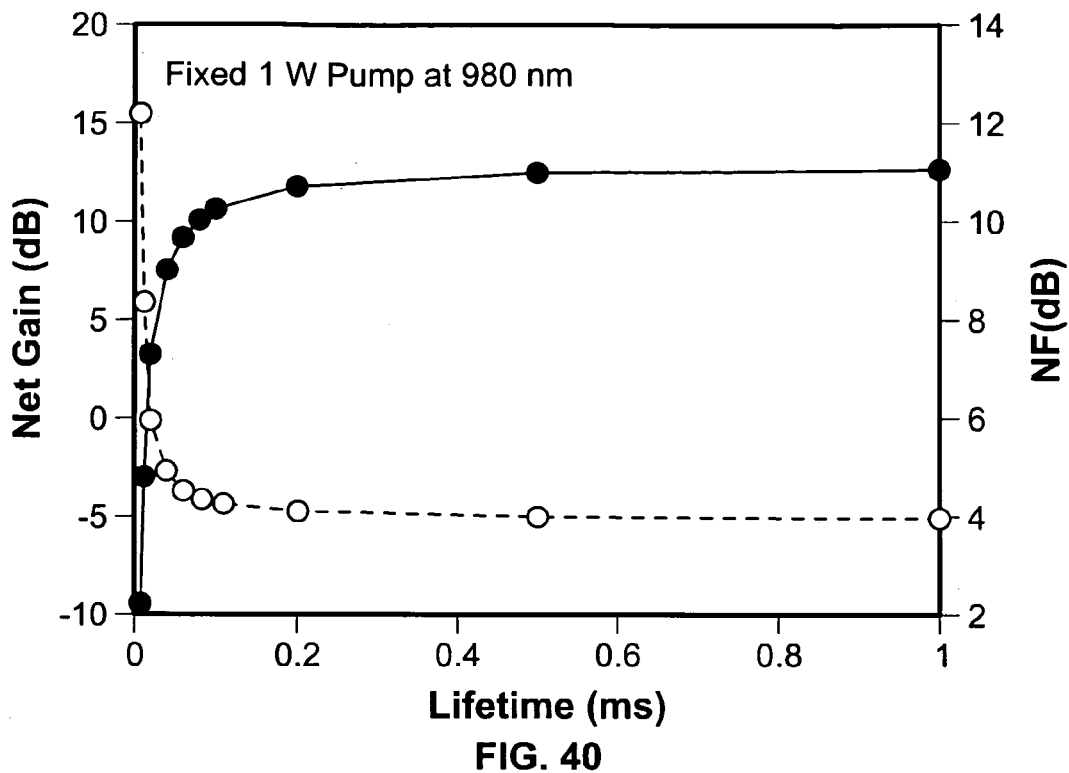
FIG. 40 is an example plot of net gain versus lifetime for a monolithically-pumped Er-doped InAlP/AlGaAs heterostructure oxide waveguide.

The Optisystem4 simulation in FIG. 40 demonstrates that, with a high pumping power of 1 W at 980 nm, a net optical gain of approximately 12 dB can be reasonably achievable with only a 0.2 ms fluorescence lifetime at 1531 nm from a 2 centimeter monolithically-pumped Er-doped InAlP/AlGaAs heterostructure oxide waveguide amplifier with parameters shown in Table 5 (below), which is significantly larger than the reported data in Table 1 (above). This high gain is attributed to the large pump power used in this calculation, possibly achievable with the new VIP scheme, but not readily available from a conventional diode laser. In this simulation, considering the much slower diffusion-limited oxidation rate of InAlP as compared to the reaction-limited oxide growth of AlGaAs, the waveguide dimension was adjusted, having a much thinner InAlP oxide core of 600 nm, achievable for a reasonable length of wet oxidation at 500° C. The emission cross sections and cooperative upconversion coefficient are all based on phosphate glasses. The Er lifetime was conservatively estimated to be approximately 0.2 ms, which is significantly lower than what was measured in FIG. 23 (i.e., greater than 1.5 ms), such that an even higher gain may be possible.

TABLE 5

| | |
|---|---|
| Waveguide length | 2 cm |
| Waveguide index profile | n = 1.5771/1.51, 4 µm × 0.6 µm (InAlP/AlGaAs oxide waveguide) |
| Waveguide loss at 1.55 µm | 0.5 dB/cm (projected) |
| Waveguide loss at 0.98 µm | 0.5 dB/cm (projected) |
| Er concentration | $10^{21}$ cm$^{-3}$ |
| Excess loss to signal | 1.05 dB/cm (impurity scattering) |
| Excess loss to pump | 1.25 dB/cm (impurity scattering) |
| Cooperative upconversion ($C_{up}$) | $2.0 \times 10^{-18}$ cm$^3$/s |
| Lifetime at 1531 nm | 0.2 ms |
| 1532 nm absorption cross section | $6.6 \times 10^{-21}$ cm$^2$ |
| 1532 nm emission cross section | $5.7 \times 10^{-21}$ cm$^2$ |
| 980 nm absorption cross-section | $2.0 \times 10^{-21}$ cm$^2$ |
| Excited state absorption at 980 nm | 0 |
| Emission cross section at 980 nm | 0 |
| Ion distribution | Step, uniformly distributed |
| Input signal power | −30 dBm |

In view of the distributed pumping advantages, key benefits are realized over conventional end pumping methods where the pump signal and gain may decay exponentially along the waveguide. In particular, the example VIP method allows the pump power to be evenly distributed along the length of the waveguide so that the entire Er-doped waveguide can operate under an improved saturated gain condition. This enables high gain to be achieved in a shorter overall length. Estimates of a net saturation gain include approximately 25 dB for an example 2 cm highly doped EDWA having [Er]=2×10$^{21}$ cm$^{-3}$ using the Er—Yb doped waveguide amplifier models in OptiWave's OptiSystem4.

Figure 41:
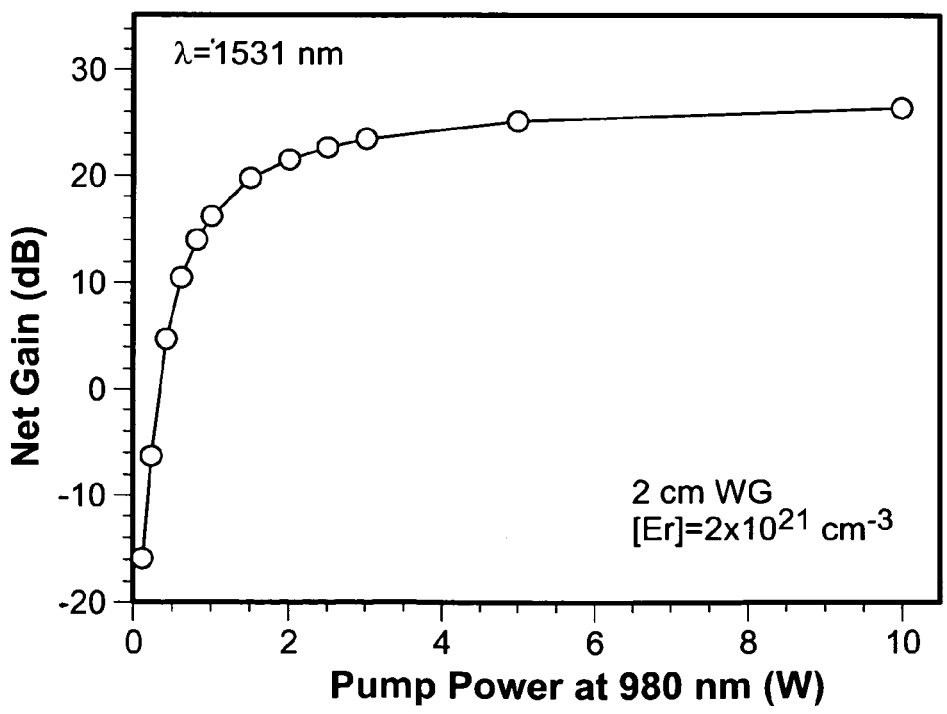
FIG. 41 is an example plot of net gain versus pump power for a heavily doped InAlP native oxide waveguide single-stage amplifier.

In this simulation, conservative adjustments are made to both the waveguide loss from the scattering on doped Er$^{3+}$ impurity ions, and the co-operative upconversion efficiency to 1×10$^{-17}$ cm$^3$/s, 5×increase from 2×10$^{-18}$cm$^3$/s with an Er concentration of 5.3×10$^{20}$ cm$^{-3}$ for an Er-doped phosphate based waveguide amplifier. Table 6 summarizes the adjusted parameters in view of FIG. 41 for a heavily doped EDWA as compared to Table 5 (above). In this simulation, the short excited state lifetime of 1 ms is also conservative. Lifetimes were measured close to 1.5 ms on a heavily doped sample with a peak Er concentration of 1.4×10$^{21}$ cm$^{-3}$ (approximately 12.1 wt. %, see FIG. 23). Notably, in this heavily doped end-pumped device, a fairly large pump power of 2-6

W is required to achieve an optical gain above 20 dB. Such high power single mode fiber-coupled pump lasers are not readily available because the heatsinking and mode control related to such a high power device adds great complexity and cost. Typical EDFA pump lasers provide no more than a few hundred mW. However, this high pump power can be readily achievable with the VIP scheme described herein, where a large volume active medium is uniformly spread beneath the Er-doped oxide layer, and the requirement of coupling the coherent power into a small dimension waveguide core is eliminated. For example, for a 4 μm wide waveguide with length of 2 cm, a total current of I=4 A could be considered reasonable, given the typical electrical pumping current densities used in high power edge-emitting laser structures up to J=5 kA/cm$^2$. The total pump power would thus be up to 5 W calculated using Equation 6.

$$P = \eta_i \frac{I}{e} E = \eta_i \frac{I}{e} \cdot \frac{hc}{\lambda} \qquad \text{Equation 6}$$

In Equation 6, e=1.6×10$^{-19}$ C is the electron charge, $\eta_i$=1 (100%) is the maximum internal quantum efficiency, E is the photon energy, c=3×10$^8$ m/s is the speed of light, h=6.626× 10$^{-23}$ J·s is Planck's constant and λ=980 nm is the wavelength of pumping light. Again, this level of pump power is very difficult to obtain in a single mode fiber for end pumping, but readily achievable through the distributed nature of the VIP pumping method. With the multiple reflections and high optical power within the vertical cavity, it is likely that lower pump powers than estimated in this example will be sufficient, and the vertical pump laser can then operate at lower current densities, largely relaxing the thermal load and requirements for temperature stability control.

TABLE 6

| | |
|---|---|
| Er concentration | 2 × 10$^{21}$ cm$^{-3}$ |
| WG scattering loss on Er ions at 980 nm | 2.1 dB/cm |
| WG scattering loss on Er ions at 1531 nm | 2.0 dB/cm |
| Co-operative upconversion efficient, C$_{up}$ | 1 × 10$^{17}$ cm$^3$/s |
| Fluorescence lifetime at $^4$I$_{13/2}$ | 1 ms |

Moreover, not only can a high pump power be achieved, but the performance of a VIP EDWA can be improved because the VIP method allows the pump power to be evenly distributed along the length of the waveguide so that the entire Er-doped waveguide can operate under the desired saturated gain condition, unlike the case with the conventional end pumping method where the pump signal is absorbed and its power decreases exponentially with distance, making it more difficult to maintain inversion and high gain operation.

In view of the noise control advantages, improvements over existing two and three stage EDFA systems are realized. In the past, such two and three stage EDFA systems were common because of their improved noise performance, but such systems required significant additional complexity, bulk and cost for each added stage. However, the example vertical distributed resonant pumping systems and methods described herein permit multiple independent pumping stages that may be easily defined through lithographically segmented contacts, as shown in FIGS. 42A and 42B. FIG. 42A illustrates simple noise control using multiple stages, and FIG. 42B illustrates a schematic of a planar Er-doped waveguide amplifier (EDWA). By varying the current injection level to each section, the amplifier noise may be effectively controlled through optimization of the gain saturation profile along the example waveguide length. Multiple stages may be added easily without additional processing steps or cost.

Lateral lasing in a quantum well layer will naturally be prevented by the spiral coiled device geometry as shown in FIGS. 42A and 42B when considering that the high-index Er-doped waveguiding structure does not extend down into the semiconductor active layer. The semiconductor active layer includes relatively weak gain guiding, thus may be insufficient to bend the light with low loss. Additionally, absorption in the unpumped regions may attenuate light leaving the pumped regions. Further lateral losses in a QW layer can be introduced by use of diamond dicing saw cuts or etched Q-spoiling trenches where needed around the example waveguide structure.

An electrical isolation layer, such as an electrical isolation layer 3940 shown in FIG. 39, will be formed by conventional methods used in oxide-isolated VCSEL devices. The electrical isolation layer 3940 may be oxidized simultaneously (by control of a mesa width and AlGaAs lateral oxidation layer Al content), or subsequent to waveguide oxidation by an additional etching and oxidation step. Unlike single mode VCSELs, which typically have small area dimensions and low output powers, the total current-pumped area beneath a ~4 μm wide x≧2-4 cm long waveguide may be quite significant, thus allowing substantial pumping power to be generated. In particular, such pumping power may be much more per unit length than is possible with the end-pumped geometry as shown in FIG. 42B. For example, at typical electrical pumping current densities used in high-power edge-emitting laser structures of J=5 kW/cm$^2$, a total injection current of I=4 A would result in a 2 cm×4 μm waveguide. The total pump power would be P=(I/q)$\eta_i$E, where q is the electron charge, $\eta_i$ is the internal quantum efficiency, and E is the photon energy in Joules. As such, for an example pump wavelength of 980 nm, $\eta_i$=100%, and I=4 A, a total pump power of 5 W results. This level of pump power is very difficult to obtain in a single mode fiber for end pumping, but readily achievable through the distributed nature of the example VIP pumping method described herein, which may be limited by heatsinking considerations. Accordingly, this example resonant pumping geometry may enable lower pump powers than estimated herein.

In view of the simplicity advantages, particular improvements over conventional end-pumping methods may be realized. In particular, no wavelength division multiplexer (WDM) components are required for multiplexing of the signal and pumping sources. Additionally, no waveguide mode-matching issues arise from the difference of pump and signal wavelengths because the pump light is not required to propagate in the signal waveguide. In amplifiers or ASE sources, feedback suppression to prevent lasing may be achieved through use of angled waveguides at the facets, potentially eliminating the need for directional isolators.

In an Er-doped planar waveguide integrated optics scheme, other passive components such as splitters, combiners, and arrayed waveguide gratings may be implemented by not implanting Er into the waveguide in these component regions. Active integrated optical components, such as variable optical attenuators and optical switches, may be realized by doping these component waveguides with Er using vertical pumping from below to control loss (or gain) by adjusting the current injection level into each pump element. Additionally, integrated optical chips incorporating vertical pumping may be used not just for amplification, but also for routing signals in metro area or enterprise network applications.

Utilizing well-established designs and fabrication methods for 980 nm vertical cavity surface emitting lasers (VCSELs), a simple process involving oxidation and/or deposition of top waveguide layers can be used to form the VIP structure of FIG. 39. To avoid the need for deep Er implants, which may require a high energy (MeV) source, top cladding layers may be deposited after conventional (~300 KeV) Er implantation and annealing.

Figure 39B:
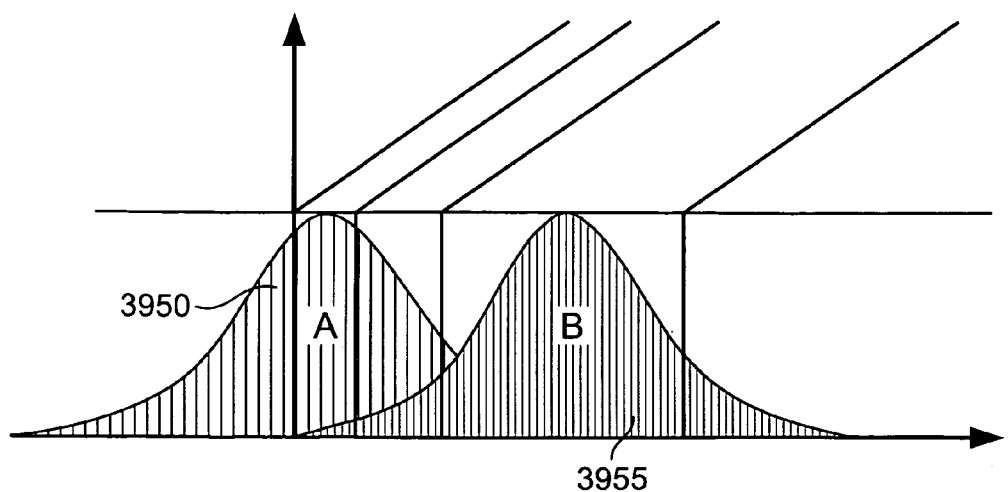
FIG. 39B illustrates an example schematic of a two-dimensional coupled waveguide system.

Another potentially viable pump-coupling method is shown in FIG. 39B. FIG. 39B illustrates coupling between two adjacent waveguides, where pump light in waveguide (A) 3950 is gradually coupled to an Er-doped amplifier waveguide (B) 3955 and the pump power is uniformly distributed on the whole Er-doped waveguide. By changing from conventional end-coupling to this distributed coupling method, the optical gain calculated for a 4 cm long sensitized neodymium-doped polymer waveguide amplifier increases from 0.005 dB to 1.6 dB. For a monolithic integration, the waveguide (A) 3950 may be a pump light source (semiconductor waveguide lasers), and the amplifier waveguides may include Er-doped native oxide waveguides fabricated on the same chip using various methods as discussed above.

The methods of Er-doping incorporated by post-oxidation implantation described above illustrate a substantially stronger $Er^{3+}$ PL from AlGaAs and InAlP native oxides. Such strength improvements include emission bandwidths and lifetime lengths comparable to those from other glass host materials widely used for EDWAs.

Erbium-Doped Waveguide Amplified Spontaneous Emission (ASE) and Laser Light Sources With emission at eye-safe wavelengths, Er-doped fiber light sources are used in many places such as broadband ASE light sources for sensing applications and pulsed Erbium lasers for range finding. With newly developed host materials as well as the novel VIP integration scheme, an Er-doped III-V oxide waveguide light source could be even more readily achievable compared to amplifiers where single mode operation may be required for compatibility with optical data networks where single mode fibers are used to minimize the dispersion and maintain a high data rate. In this section, we will briefly go through several possible devices and give some initial device designs and related considerations for future fabrication efforts.

Figure 43:
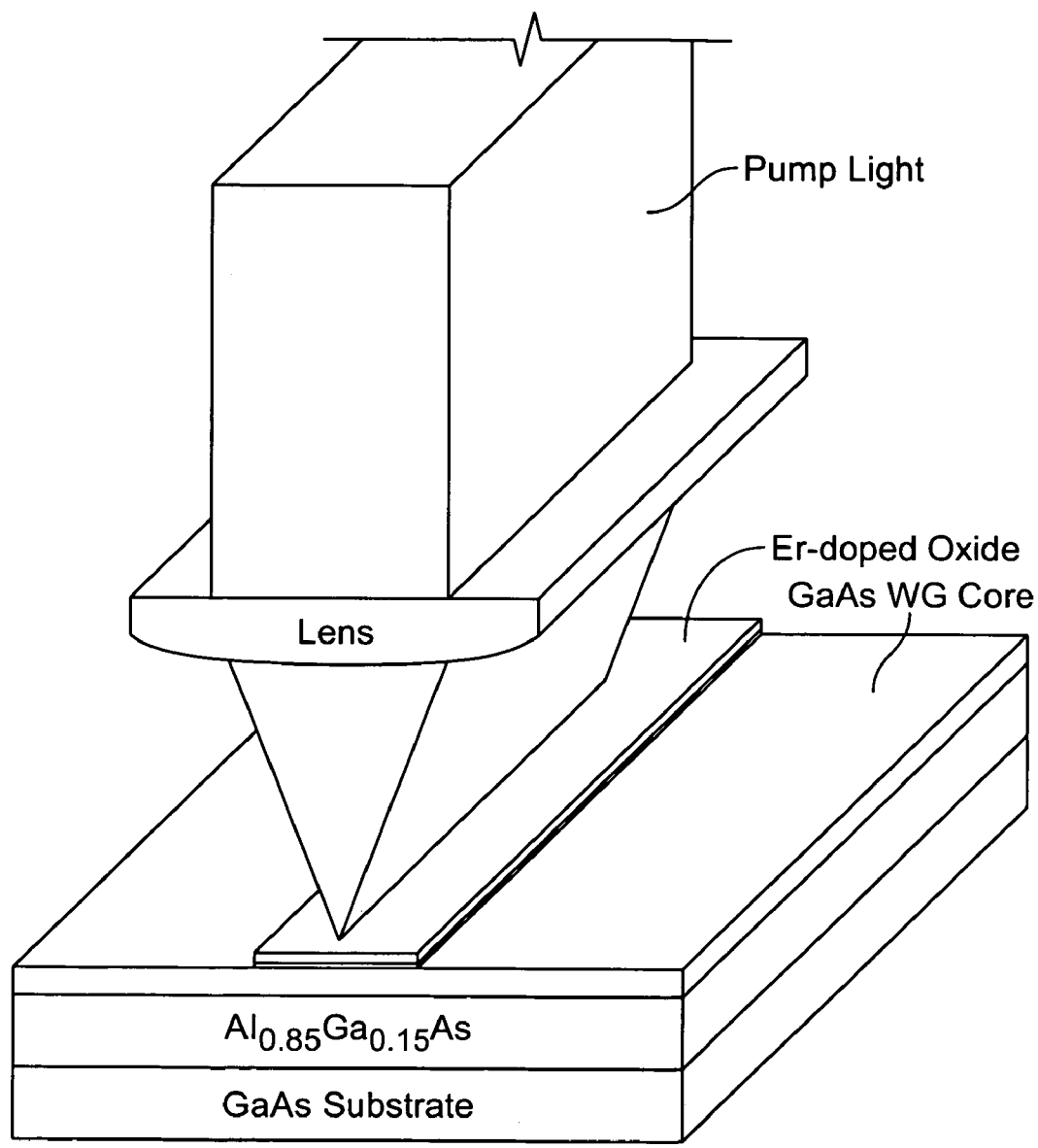
FIG. 43 illustrates an example schematic of an operation of a surface pumped Er-doped InAlP native oxide waveguide light source.

FIG. 43 shows a simplified design of an Er-doped InAlP native oxide waveguide ASE light source utilizing the broad emission linewidth from the Er-doped InAlP native oxide. With cleaved facets or deposited mirrors, this ASE light source could be operated as an Er-doped waveguide laser (EDWL). The external vertical surface pumped scheme can ultimately be replaced with our VIP design to allow for monolithic pump integration.

In view of the rare earth hosts for Er-doped layers and InAlP oxides described herein, Erbium-doped waveguide lasers (EDWL) are realized. In particular, because the example hosts described herein are semiconductor based, the host offers a unique key advantage over other planar waveguide host materials in the ability to monolithically integrate an Er-active medium excitation source, resulting in the potential for a low cost device. Additionally the long excited state lifetimes (e.g., up to τ-8 mS), the energy storage ability of this solid-state gain medium makes the possibility for a high-energy Q-switched pulsed-output EDWL operating at eye-safe wavelengths (e.g., λ~1.53 μm).

Lasers operating at eye-safe wavelengths have numerous applications including, but not limited to, military range finding applications. Range finding typically requires a Q-switched, high peak power laser pulse, typically ~3 mJ in a 10 ns pulse (300 kW peak power). Present systems typically use a diode or flashlamp-pumped neodymium-doped yttrium aluminum garnet (Nd:YAG) laser with a nonlinear optical parametric oscillator (OPO) to convert the wavelength to approximately 1.5 μm in the eye-safe spectral region. The lifetime of approximately ~300 μs for the solid-state Nd transition allows energy storage from the pump between Q-switched output pulses. Semiconductor lasers are simply unable to deliver high peak powers required for range finding because of their very short (ns) electron-hole radiative recombination times. However, the example Er-doped native oxide hosts described herein are very attractive options compared to present systems because of their greater lifetimes (e.g., 2-8 ms) and the ability to directly emit at eye-safe wavelengths without the need for nonlinear frequency conversion. Such advantages may lead to greater efficiency and lower-power consumption components. The example monolithic pump laser integration also enables a lower-cost, more robust, and higher reliability range finder device.

One issue of concern with small cross-section waveguide laser devices is the limited power density that can be reliably managed without incurring optical damage at the laser output aperture. As mentioned below, this issue may be overcome by using broad-area active regions with surface-emitting grating out-couplers to distribute the power over a larger emission aperture for both reduced power density and improved output beam divergence properties.

Such devices are realized in view of the example VIP excitation scheme described above. In addition to developing a continuous wave EDWL device and investigating Q-switching in an external cavity, Q-switching functionality may also be integrated "on-chip."

Returning briefly to FIG. 39, the reflectance of a top gold metal mirror need not necessarily match the high reflectance typically found in multilayer DBR reflectors because, with Yb co-doping, even spectrally broad spontaneous emission luminescence (below the vertical pump lasing threshold) may be effectively absorbed to pump the Er in the EDWL core. A reasonably high Q vertical cavity is helpful, however, to enhance emission into the vertical cavity mode. Lateral lasing within the semiconductor quantum well heterostructure active layer may be suppressed by use of unpumped regions, etched trenches, and/or other loss mechanisms as needed. As discussed above, the electrical isolation layer may be formed by conventional methods used in oxide-isolated VCSEL devices, and may be oxidized simultaneously (by control of mesa width and AlGaAs lateral oxidation layer Al content), or oxidized subsequent to waveguide oxidation by an additional etching and oxidation step.

Figure 44:
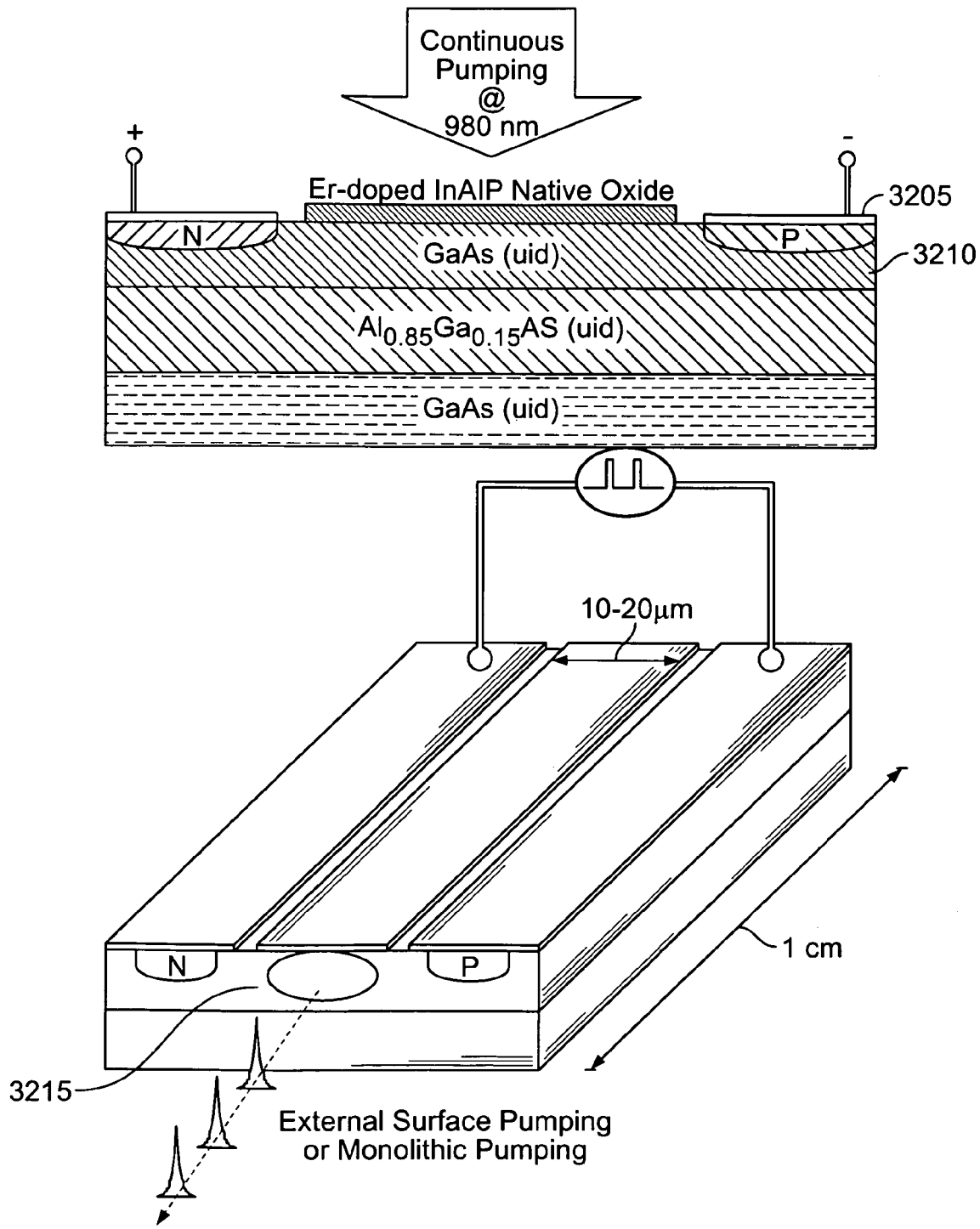
FIG. 44 illustrates an example scheme for integrating Q-switching into an EDWL.

As described above, Q-switching may be integrated into the EDWL chip in a variety of ways. In one example, a lateral PIN junction 4405 is used to electrically inject free carriers into a GaAs waveguide core 4410, thereby increasing the absorption loss at the ~1.53 μm Er emission wavelength, as shown in FIG. 44. Lateral PIN diodes of these dimensions are frequently encountered in photodetectors, and typically provide a viable method for controlling waveguide loss. Under forward bias, a high density of injected electrons and holes (free carriers) will lead to increased intraband free carrier absorption and high loss with minimum feedback. When reverse biased, the lateral PIN diode 4405 will enhance EDWL performance by extracting free carriers, leading to minimum possible absorption for a low-loss waveguide 4415. In this example, the cavity will provide maximum feedback and resonance, and the "Q-switch" will be "on". The switching time constant is assumed to be much less than the $Er\ ^4I_{13/2}$ lifetime of τ>1 ms.

Compared to bulk solid state lasers, limitations may be imposed upon a small cross-sectional area waveguide emitter device by virtue of the maximum power density possible at the output facet before incurring catastrophic damage at the output aperture through excessive heating and possible melting. The example GaAs core waveguide is similar in thickness and material to semiconductor edge-emitting lasers, thus similar classes of devices are referenced for guidance regarding power density limits. Conventional edge-emitting semiconductor laser devices having ~1 μm high apertures can typically operate at power densities of ~10 W/mm. A 1 cm wide bar 50% fill factor can reach CW output powers of 60 W. Operating with 300 nS pulses, a semiconductor high power optical amplifier can emit at least 6-10 times greater peak power than under CW operation, perhaps higher for even shorter pulses. By utilizing non-absorbing mirrors, 3 μm wide ridge waveguide lasers operating at 400 nS pulses have shown uncoated facet catastrophic optical mirror damage (COMD) thresholds of ≧600 mW, or a lineal power density of 200 W/mm, with higher values achievable with facet coatings. This corresponds to a pulse lineal energy density of 200 W/mm*400 nS=80 μJ/mm. Using this value and a broad area device total aperture of 1.25 mm, feasibility of a 100 μJ edge emitting device with a non-absorbing mirror facet technology and coated facets is apparent.

Good beam quality of a large aperture device may be possible when considering that the filamentation issues limiting output performance in semiconductor broad-area tapered amplifiers are avoided in an inhomogeneously-broadened Er gain medium. These calculations make the reasonable assumption that the peak power density can be increased ~20× as the laser pulse width is reduced 20×, maintaining the same total pulse energy density.

Energy estimates for achieving a 100 μJ pulse from an edge-emitting Er-doped waveguide laser are described below. The laser output energy may be estimated as OutputEnergy=$N_{Er}VE_{ph}\eta_{ex}$, where $N_{Er}$ is the density of optically active Er ions, V is the active volume, $E_{ph}$ is the photon energy and $\eta_{ex}$ is the external conversion efficiency (stimulated photons emitted from the laser per excited Er ion). Er-doped InAlP native oxides may have a peak concentration of $N_{Er}$~$10^{21}$ cm$^{-3}$ (~5 wt. %). Such oxides may have a thickness of t=300 nm, which is achievable by oxidizing ~175 nm of InAlP for approximately 4 hours at 500° C. Furthermore, a broad area active region of width w=3 mm and length L=1 cm (the laser cavity length) results in an active volume of V=twL=9×$10^{-6}$ cm$^3$. External conversion efficiency is assumed to be $\eta_{ex}$=0.3 (30%). For these values and the above equation, a total laser output energy is calculated to be approximately 350 μJ, which suggests that useful output powers may be achievable for an edge-emitting device.

Pump power requirements for a cw vertical-intracavity pumping configuration are discussed below for achieving the above 350 μJ output pulse from an example Q switched laser. For the doping concentration described above, an excited state lifetime of 3 ms has been measured, which is about a factor of 10 greater than that of Nd:YAG solid state lasers. Such measurements indicate very favorable conditions for storing energy for Q-switched conversion to a high-peak power and short duration output pulse. Estimations of the pumping requirements indicate that a 350 μJ, 10 ns output pulse has an average peak power of 350 μJ/10 ns=3.5 kW. However, storing 350 μJ for an excited state lifetime of 3 ms requires an equivalent continuous output level of only 350 μJ/3 ms=0.117 W at an emission wavelength of 1.53 μm. As such, considering the conversion loss when pumping Er at 0.98 μm and an additional conservatively estimated 0.3 (30%) pump absorption efficiency, a 980 nm pump power of 0.117 W×(1.53/0.98)/0.3=0.609 W would be required. This is feasible when considering that commercial 980 nm laser diode bars are now available. For available 60 W cw bars with an active area of 49 (100 μm×1 mm) emitters, a power density of 1.22 kW/cm$^2$ is achieved at the operating current density of 1531 A/cm$^2$. Considering that the output power per area for a quantum-well heterostructure semiconductor laser should be comparable in either an emission directed in-plane or vertically (as required for vertical-intracavity pumping), this would correspond to an available pump power for monolithic pumping of the example EDWL device (area wL=0.3 cm$^2$) of 367 W, which is 3150 times more than required. Thus, it is reasonable to expect a reduction in the operating current to a density of approximately 2.54 A/cm$^2$, which suggests that a 350 μJ output laser of area wL=0.3 cm$^2$ would require only 760 mA of drive current and could be expected to operate without active cooling required for portable use. The inherent excellent temperature-dependent wavelength stability of the rare earths, owing to their shielded intra 4f shell optical transitions, is one of the great advantages of an EDWL device. Various consumers, such as the military, may require that range finder lasers have no start up delay and, hence, not require active cooling to operate. The example EDWL devices described herein can meet this requirement.

In a cw laser, the Er ions can be excited and deexcited through stimulated emission repeatedly, such that the total energy emission can exceed the amount possible in one Q-switched output pulse, though at a much lower average power. As a corollary to the above calculation, estimations of a continuous-wave (cw) edge-emitting planar EDWL of the same dimensions using the full typical semiconductor laser pump power density of 1.22 kW/cm$^2$ could emit as much as 70 W of cw, eye-safe power (1.22 kW/cm$^2$×wL×(0.98/1.53)× 0.3=70 W). The 30% pump absorption efficiency used above may be very reasonable for the resonant intracavity pumping method described herein, particularly with the use of Yb codoping discussed above. Similar to laser diode bars, the active area can be subdivided into an array of parallel active stripes to a fill factor of 50% or less in order both reduce the thermal power density, but also, for our VIP design, to enable the required current injection beneath the Er-doped oxide active layer for the monolithic pump source.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of doping an oxide, comprising:
   forming an InAlP oxide host on a substrate by controlling a composition of the oxide;
   broadening a photoluminescence spectral width value by incorporating Erbium into the InAlP oxide via ion implantation to form an Erbium-doped oxide layer; and
   annealing the substrate and the InAlP oxide.

2. A method of doping an oxide as defined in claim 1, wherein controlling the composition of the oxide further comprises controlling at least one of an In concentration, an Al concentration, or a P concentration of the InAlP oxide.

3. A method of doping an oxide as defined in claim 1, wherein the annealing is performed between 500 and 800 degrees Celsius.

4. A method of doping an oxide as defined in claim 1, wherein the Erbium is incorporated at a dosage of at least 1×$10^{+15}$ cm$^{-2}$.

5. A method of doping an oxide as defined in claim 1, further comprising placing the Erbium-doped oxide layer between a lower semiconductor layer and an upper semiconductor layer to form an optical waveguide.

6. A method of doping an oxide as defined in claim 1, wherein the substrate is GaAs.

7. A method of doping an oxide as defined in claim 5, wherein an interface between the Erbium-doped oxide layer and the lower semiconductor layer, and an interface between the Erbium-doped oxide layer and the upper semiconductor layer comprise a large refractive index sufficient to confine light.

8. A method of doping an oxide as defined in claim 5, wherein the upper semiconductor layer comprises deposited $SiO_2$, the upper semiconductor layer forming a waveguide cladding.

9. A method of doping an oxide as defined in claim 5, further comprising forming an electrical contacting layer under the lower semiconductor layer and a vertical resonant cavity under the electrical contacting layer to facilitate pump light oscillation inside the vertical resonant cavity.

10. A method of doping an oxide as defined in claim 9, wherein the vertical resonant cavity comprises a top metal mirror and a bottom distributed Bragg reflector (DBR) mirror, the mirrors surrounding an InGaAs quantum well heterostructure (QWH).

11. A method of doping an oxide as defined in claim 10, further comprising forming a p-n diode active region around the QWH, the active region generating light for pump excitation of Erbium ions.

12. A method of doping an oxide as defined in claim 11, further comprising co-doping the InAlP oxide with Ytterbium to facilitate absorption of QWH broadband emission.

13. A method of doping an oxide as defined in claim 12, wherein the active region operates in an incoherent emission regime below a lasing current threshold.

14. A method of doping an oxide as defined in claim 9, wherein the optical waveguide functions as at least one of a monolithically pumped amplifier, a broadband amplified spontaneous emission (ASE) light source, or a laser.

15. A method of doping an oxide as defined in claim 14, wherein the laser operates in at least one of a continuous wave (cw) mode or a pulsed mode.

16. A method of doping an oxide as defined in claim 15, further comprising at least one of Q-switching or mode-locking to operate in the pulsed mode.

17. A method of doping an oxide as defined in claim 14, wherein the at least one amplifier or laser comprises a wavelength of approximately 1.53 microns.

18. A method of doping an oxide as defined in claim 14, wherein the at least one amplifier or ASE light source comprises a full-width-half-maximum optical emission bandwidth between 40 nm and 60 nm.

19. A method of doping an oxide as defined in claim 1, wherein forming the Erbium-doped oxide layer further comprises broadening an Er emission width value in the InAlP oxide host.

20. A method of doping an oxide as defined in claim 19, wherein the Er emission width value is at least 61 nanometers.

21. A method of doping an oxide as defined in claim 1, wherein forming the Erbium-doped oxide layer further comprises increasing an Er luminescence lifetime value in the InAlP oxide host.

22. A method of doping an oxide as defined in claim 21, wherein the Er luminescence lifetime value is at least 8 milliseconds.

23. An Erbium-doped waveguide device, comprising:
at least one InAlP oxide formed on a substrate, the InAlP oxide doped with Erbium after oxidation to minimize photoluminescence-quenching As complexes; and
a lower semiconductor layer and an upper semiconductor layer, the upper and lower layers surrounding the Erbium-doped InAlP oxide to form an optical waveguide therein.

24. An Erbium-doped waveguide device as defined in claim 23, wherein the substrate comprises GaAs.

25. An Erbium-doped waveguide device as defined in claim 23, wherein the device comprises:
an electrical contacting layer under the lower semiconductor layer; and
a vertical cavity under the electrical contacting layer to facilitate an optical pump.

26. An Erbium-doped waveguide device as defined in claim 25, wherein the waveguide device comprises at least one of a monolithically pumped amplifier, a broadband amplified spontaneous emission (ASE) light source, or a laser.

* * * * *

UNITED STATES PATENT AND TRADEMARK OFFICE
CERTIFICATE OF CORRECTION

| | | |
|---|---|---|
| PATENT NO. | : 7,655,489 B2 | Page 1 of 1 |
| APPLICATION NO. | : 12/123257 | |
| DATED | : February 2, 2010 | |
| INVENTOR(S) | : Douglas Hall et al. | |

It is certified that error appears in the above-identified patent and that said Letters Patent is hereby corrected as shown below:

In Column 1, Line 23:

After the sentence ending "... Research (AFOSR).",
insert -- The government has certain rights in the invention. --

Signed and Sealed this
Sixteenth Day of August, 2011

David J. Kappos
*Director of the United States Patent and Trademark Office*